United States Patent
Archer

(10) Patent No.: US 9,548,467 B2
(45) Date of Patent: Jan. 17, 2017

(54) ORGANIC LIGHT-EMITTING DEVICE INCORPORATING A TRIPLET-TRIPLET ANNIHILATION PROMOTER AND METHOD OF FORMING THE SAME

(71) Applicants: Cambridge Display Technology Limited, Godmanchester (GB); Sumitomo Chemical Company Limited, Tokyo (JP)

(72) Inventor: Robert Archer, Godmanchester (GB)

(73) Assignees: Cambridge Display Technology Limited, Godmanchester (GB); Sumitomo Chemical Company Limited, Tokyo (JP)

( * ) Notice: Subject to any disclaimer, the term of this patent is extended or adjusted under 35 U.S.C. 154(b) by 81 days.

(21) Appl. No.: 14/398,921

(22) PCT Filed: May 3, 2013

(86) PCT No.: PCT/GB2013/051171
§ 371 (c)(1),
(2) Date: Nov. 4, 2014

(87) PCT Pub. No.: WO2013/164647
PCT Pub. Date: Nov. 7, 2013

(65) Prior Publication Data
US 2015/0115245 A1    Apr. 30, 2015

(30) Foreign Application Priority Data

May 4, 2012    (GB) .................................. 1207866.3

(51) Int. Cl.
*H01L 29/08* (2006.01)
*H01L 35/24* (2006.01)
(Continued)

(52) U.S. Cl.
CPC ....... *H01L 51/5016* (2013.01); *H01L 51/0035* (2013.01); *H01L 51/504* (2013.01);
(Continued)

(58) Field of Classification Search
CPC .. H01L 51/5016; H01L 51/5028; H01L 51/56; H01L 51/0035; H01L 51/5036; H01L 51/504
See application file for complete search history.

(56) References Cited

U.S. PATENT DOCUMENTS

2006/0232194 A1   10/2006  Tung et al.
2008/0286610 A1   11/2008  Deaton et al.
2012/0097998 A1    4/2012  Pieh et al.

FOREIGN PATENT DOCUMENTS

EP    2 166 589 A1   3/2010
EP    2 166 591 A1   3/2010
(Continued)

OTHER PUBLICATIONS

International Search Report and Written Opinion for International Application No. PCT/GB2013/051171 mailed Nov. 15, 2013.
(Continued)

*Primary Examiner* — Stephen W Smoot
*Assistant Examiner* — Vicki B Booker
(74) *Attorney, Agent, or Firm* — Wolf, Greenfield & Sacks, P.C.

(57) ABSTRACT

Provided are organic light-emitting devices having an anode; a cathode; a first light-emitting layer between the anode and the cathode, the first light-emitting layer having a fluorescent light-emitting material with a triplet excited state energy level $T_{1F}$ and a triplet-triplet annihilation (TTA) promoter with a triplet excited state energy level $T_{1T}$, wherein $T_{1F>1T}$; and a second light-emitting layer between the anode and the cathode and adjacent to the first light-
(Continued)

emitting layer, the second light-emitting layer having a phosphorescent material with a triplet excited state energy level $T_{1P}$, wherein $T_{1P} > T_{1T}$.

18 Claims, 8 Drawing Sheets

(51) Int. Cl.
    *H01L 51/00*     (2006.01)
    *H01L 51/50*     (2006.01)
    *H01L 51/56*     (2006.01)

(52) U.S. Cl.
    CPC ...... *H01L 51/5028* (2013.01); *H01L 51/5036* (2013.01); *H01L 51/56* (2013.01); *H01L 51/0039* (2013.01); *H01L 51/0043* (2013.01); *H01L 51/0085* (2013.01); *H01L 2251/5376* (2013.01)

(56) References Cited

FOREIGN PATENT DOCUMENTS

WO    WO 2011/161425 A1    12/2011
WO    WO 2012/052713 A1    4/2012

OTHER PUBLICATIONS

Office Communication dated Aug. 28, 2012 for Great Britain Application No. GB1207866.3.

ORGANIC LIGHT-EMITTING DEVICE INCORPORATING A TRIPLET-TRIPLET ANNIHILATION PROMOTER AND METHOD OF FORMING THE SAME

RELATED APPLICATIONS

The present application is a national stage filing under 35 U.S.C. §371 of international PCT application, PCT/GB2013/051171, filed May 3, 2013, which claims priority to United Kingdom patent application, GB 1207866.3, filed May 4, 2012, each of which is incorporated herein by reference.

SUMMARY OF THE INVENTION

The present invention relates to organic light-emitting devices and methods of making the same.

BACKGROUND

Electronic devices comprising active organic materials are attracting increasing attention for use in devices such as organic light emitting diodes (OLEDs), organic photoresponsive devices (in particular organic photovoltaic devices and organic photosensors), organic transistors and memory array devices. Devices comprising organic materials offer benefits such as low weight, low power consumption and flexibility. Moreover, use of soluble organic materials allows use of solution processing in device manufacture, for example inkjet printing or spin-coating.

An OLED may comprise a substrate carrying an anode, a cathode and one or more organic light-emitting layers between the anode and cathode.

Holes are injected into the device through the anode and electrons are injected through the cathode during operation of the device. Holes in the highest occupied molecular orbital (HOMO) and electrons in the lowest unoccupied molecular orbital (LUMO) of a light-emitting material combine to form an exciton that releases its energy as light.

Suitable light-emitting materials include small molecule, polymeric and dendrimeric materials. Suitable light-emitting polymers include poly(arylene vinylenes) such as poly (p-phenylene vinylenes) and polyarylenes such as polyfluorenes.

A light emitting layer may comprise a semiconducting host material and a phosphorescent material wherein energy is transferred from the host material to the phosphorescent material. For example, J. Appl. Phys. 65, 3610, 1989 discloses a host material doped with a fluorescent light-emitting dopant (that is, a light-emitting material in which light is emitted via decay of a singlet exciton) and Appl. Phys. Lett., 2000, 77, 904 discloses a host material doped with a phosphorescent light emitting dopant (that is, a light-emitting material in which light is emitted via decay of a triplet exciton).

Emission from more than one layer of an OLED, in particular to achieve white light emission, is disclosed in, for example, WO 2008/131750, DE 102007020644 and EP1390962 and SPIE (2004), 5519, 42-47.

WO 2005/043640 discloses that blending a perylene derivative with an organic light-emissive material in an organic light-emissive device can give a small increase in the lifetime of the device. However, while higher concentrations of perylene derivative give greater improvements in lifetime this results in a significant red-shift in the emission spectrum.

US 2007/145886 discloses an OLED comprising a triplet-quenching material to prevent or reduce triplet-triplet or triplet-singlet interactions.

US 2005/095456 discloses an OLED having a light-emitting layer comprising a host material, a dye or pigment and an additive exhibiting an absorption edge of which energy level is higher than that of an absorption edge of the dye or the pigment WO 2011/161425 discloses a fluorescent light-emitting polymer comprising light-emitting repeat units, and a triplet-accepting unit.

SUMMARY OF THE INVENTION

In a first aspect, the invention provides an organic light-emitting device comprising:

an anode;

a cathode;

a first light-emitting layer between the anode and the cathode, the first light-emitting layer comprising a fluorescent light-emitting material having a triplet excited state energy level $T_{1F}$ and a triplet-triplet annihilation (TTA) promoter having a triplet excited state energy level $T_{1T}$ wherein $T_{1F} > T_{1T}$; and a second light-emitting layer between the anode and the cathode and adjacent to the first light-emitting layer, the second light-emitting layer comprising a phosphorescent material having a triplet excited state energy level $T_{1P}$ wherein $T_{1P} > T_{1T}$.

Optionally, the TTA promoter has a singlet excited state energy level $S_{1T}$ and the fluorescent light-emitting material has a singlet excited energy level $S_{1F}$ wherein $S_{1T} > S_{1F}$.

Optionally, the fluorescent light-emitting material is blended with the TTA promoter.

Optionally, the TTA promoter is bound to the fluorescent light-emitting material.

Optionally, the fluorescent light-emitting material is a blue light-emitting material.

Optionally, the fluorescent light-emitting material is a polymer. Optionally, the polymer comprises repeat units of formula (IV):

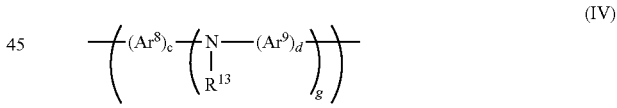

wherein $Ar^8$ and $Ar^9$ in each occurrence are independently selected from substituted or unsubstituted aryl or heteroaryl, g is greater than or equal to 1, preferably 1 or 2, $R^{13}$ is H or a substituent, preferably a substituent; c and d are each independently 1, 2 or 3; and any one of $Ar^8$, $Ar^9$ and $R^{13}$ bound directly to a N atom may be linked to another of $Ar^8$, $Ar^9$ and $R^{13}$ bound to the same N atom.

Optionally, the fluorescent light-emitting material:TTA promoter molar ratio is in the range of 80:20-99.9:0.1, optionally in the range 90:10-99.9:0.1, optionally in the range 95:15-99.9:0.1.

Optionally, the half-life of triplet excitons on the TTA promoter is at least 1 microsecond.

Optionally, the TTA promoter comprises substituted or unsubstituted anthracene.

Optionally, the TTA promoter is a polymer comprising repeat units of formula (V):

$$-(PAH)- \qquad (V)$$

wherein PAH represents a polyaromatic hydrocarbon that may be unsubstituted or substituted with one or more substituents.

Optionally, the TTA promoter is a polymer comprising substituted or unsubstituted repeat units of formula (Va):

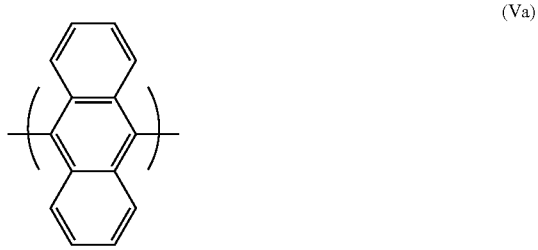

(Va)

Optionally, the repeat unit of formula (Va) is substituted with one or more $C_{1-20}$ alkyl groups.

Optionally, the phosphorescent light-emitting material is a red light-emitting material.

Optionally, the second light-emitting layer comprises a host material.

Optionally, the device comprises at least one further light-emitting layer.

Optionally, the at least one further light-emitting layer is spaced apart from the first light-emitting layer by the second light-emitting layer.

Optionally, the at least one further light-emitting layer is a green light-emitting layer Optionally, the at least one further light-emitting layer is a phosphorescent light-emitting layer.

Optionally, the device is a white light emitting OLED.

In a second aspect, the invention provides a method of forming an OLED according to the first aspect comprising the steps of forming, in any order, the first light-emitting layer and second light-emitting layer over one of the anode and the cathode, and forming the other of the anode and the cathode over the first and second light-emitting layers.

Optionally according to the second aspect, the first and second light-emitting layers are each independently deposited from a solution in at least one solvent followed by evaporation of the at least one solvent.

Optionally according to the second aspect, the first-deposited layer of the first and second light-emitting layers does not dissolve in the at least one solvent used to deposit the second-deposited layer.

Optionally according to the second aspect, the first-deposited layer is crosslinked prior to formation of the second-deposited layer.

"Arylene" and "heteroarylene" as used herein includes aromatic and heteroaromatic groups having a single ring and aromatic and heteroaromatic groups having a fused ring structure.

DESCRIPTION OF THE DRAWINGS

The invention will now be described in more detail with reference to the drawings, in which.

DETAILED DESCRIPTION OF THE INVENTION

Figure 1:
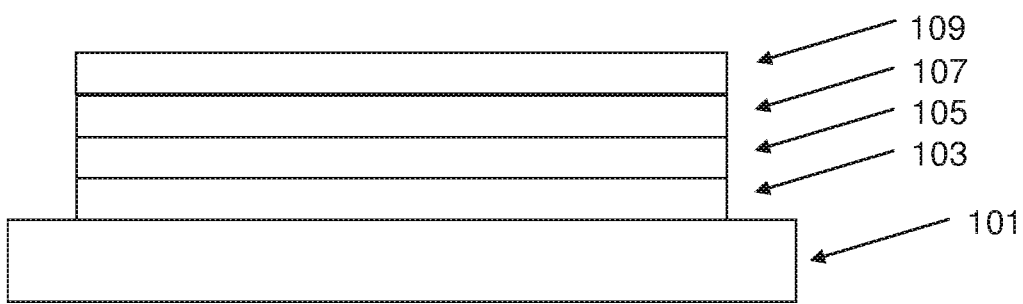
FIG. 1 is a schematic illustration of an OLED according to an embodiment of the invention.

FIG. 1 illustrates an OLED according to an embodiment of the invention.

The OLED comprises an anode 103, a phosphorescent light-emitting layer 105, a fluorescent light-emitting layer 107 and a cathode 109. The fluorescent light-emitting layer 107 contains a fluorescent light-emitting material and a TTA promoter. The OLED is supported on a substrate 101, for example a glass or plastic substrate. Light may be emitted through a transparent substrate 101 and transparent anode 103, or light may be emitted through a transparent cathode 109 in which case the anode 103 and substrate 101 may each be transparent or opaque, and may be reflective.

In the embodiment of FIG. 1, the fluorescent light-emitting layer 107 is between the phosphorescent light-emitting layer 105 and the cathode. In other embodiments, the phosphorescent light-emitting layer 105 may be between the fluorescent light-emitting layer 107 and the cathode One or more further layers may be located between anode 103 and the cathode 109. Further layers may be selected from further light-emitting layers, charge transporting layers, charge injecting layers and charge blocking layers.

Exemplary light-emitting structures include the following:
Anode/Light-emitting layers/Cathode
Anode/Hole injection layer/Light-emitting layers/Cathode
Anode/Hole injection layer/Hole-transporting layer/Light-emitting layers/Cathode The light-emitting layers may consist of a phosphorescent layer and an adjacent fluorescent light-emitting layer, or may contain one or more further light-emitting layers. A further light-emitting layer may be a fluorescent or phosphorescent light-emitting layer. Preferably, the device contains two or three light-emitting layers. One light-emitting layer may contain two different light-emitting materials that emit light of different peak wavelengths.

In a preferred embodiment, emissions from the light-emitting layers combine to produce white light. White light may be produced by a combination of blue and yellow light or by a combination of red, green and blue light. Exemplary light-emitting layer combinations include:

Green phosphorescent/Red phosphorescent/Blue fluorescent

Red phosphorescent and Green phosphorescent/Blue fluorescent

Yellow phosphorescent/Blue fluorescent

Yellow phosphorescent/Red phosphorescent/Blue fluorescent

A blue light-emitting material may have a photoluminescent spectrum with a peak in the range of 400-490 nm A green emitting phosphorescent material may have a photoluminescent spectrum with a peak in the range of more than 490-560 nm.

A yellow emitting phosphorescent material may have a photoluminescent spectrum with a peak in the range of more than 560-590 nm.

A red emitting phosphorescent material may have a peak in its photoluminescent emission spectrum at around more than 590-700 nm.

A white-emitting OLED may contain a single, white-emitting layer or may contain two or more layers that emit different colours which, in combination, produce white light. The light emitted from a white-emitting OLED may have CIE x coordinate equivalent to that emitted by a black body at a temperature in the range of 2500-9000K and a CIE y coordinate within 0.05 or 0.025 of the CIE y co-ordinate of said light emitted by a black body, optionally a CIE x coordinate equivalent to that emitted by a black body at a temperature in the range of 2600-4500K.

Each light-emitting layer may have a thickness in the range of about 10-100 nm.

Figure 2:
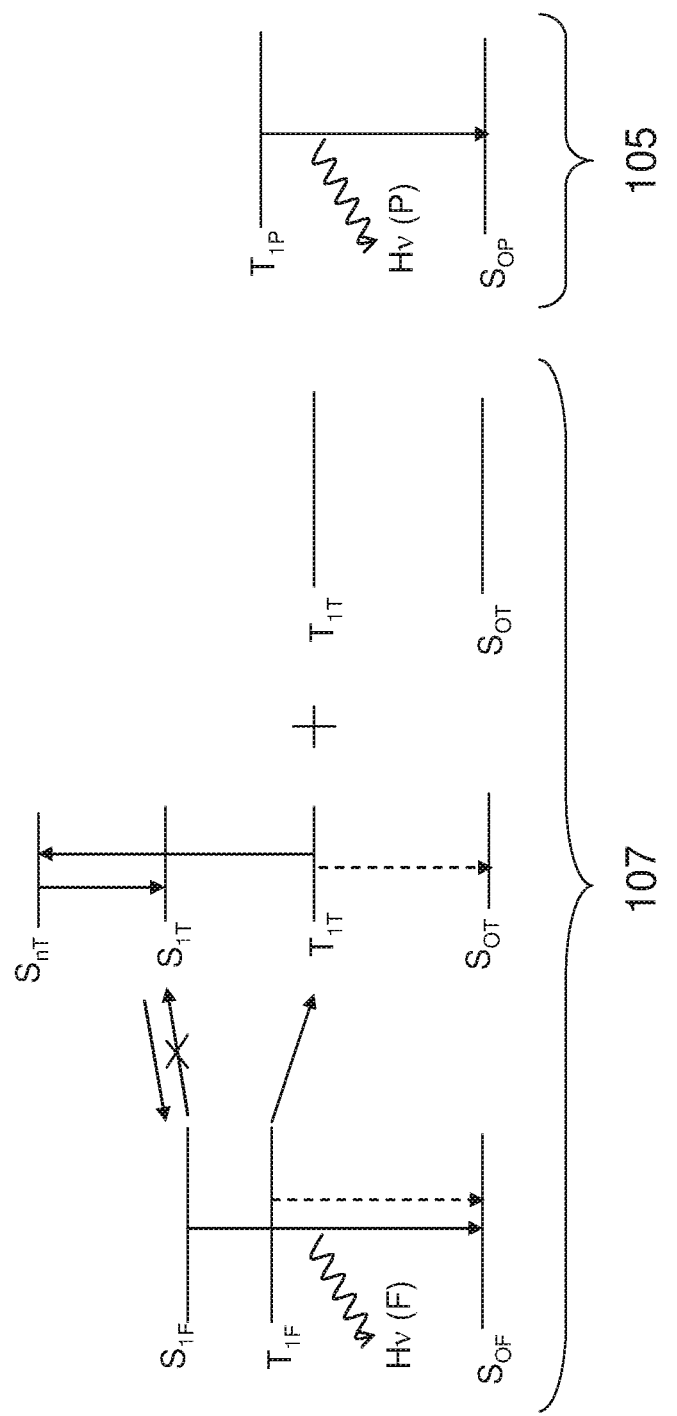
FIG. 2 illustrates a first triplet-triplet annihilation mechanism for a device according to an embodiment of the invention.

FIG. 2 illustrates a first energy transfer mechanism for an OLED according to an embodiment of the invention in which the OLED comprises a fluorescent light-emitting material and a triplet-triplet annihilation (TTA) promoter in fluorescent light-emitting layer 107 of the OLED. The fluorescent light emitting material and TTA promoter may be separate materials that are blended together in the light-emitting layer. Alternatively, the TTA promoter may be bound to the light-emitting material; for example, the light-emitting material and TTA promoter may be in the form of a conjugated or non-conjugated polymer comprising light-emitting repeat units and TTA-promoting repeat units.

In operation, singlet and triplet excitons having energy levels $S_{1F}$ and $T_{1F}$ respectively are formed on the fluorescent light-emitting material. Singlet excitons having energy $S_{1F}$ may decay by emission of fluorescent light hv, illustrated by the solid arrow between $S_{1F}$ and $S_{0E}$ in FIG. 2. Decay of triplet excitons from $T_{1F}$ to $S_{0F}$, illustrated by a dotted arrow in FIG. 1, is a spin-forbidden process.

Triplet excitons formed at $T_{1F}$ may be transferred to a triplet excited level $T_{1T}$ of the TTA promoter. By providing a TTA promoter having energy level $T_{1T}$ that is lower than $T_{1F}$, rapid transfer of excitons from $T_{1F}$ to $T_{1T}$ may occur. This transfer may be relatively rapid compared to the spin-forbidden process of decay of triplet excitons from $T_{1F}$ to $S_{0F}$.

The energy gap between $T_{1F}$ and $T_{1T}$ is preferably greater than kT in order to avoid back-transfer of excitons from $T_{1T}$ to $T_{1F}$. The singlet excited state $S_{1F}$ of the fluorescent material is preferably lower than the single excited state energy level $S_{1T}$ of the TTA promoter. The energy gap between $S_{1T}$ and $S_{1F}$ is preferably greater than kT in order to avoid transfer of excitons from $S_{1F}$ to $S_{1T}$.

Triplet-triplet annihilation (TTA) to produce delayed fluorescence may be caused by an interaction between two TTA promoters, resulting in formation of a triplet-triplet annihilated singlet exciton having an energy of up to $2 \times T_{1T}$. This singlet exciton, formed on a first of the two triplet promoter units, has energy level $S_{nT}$ that is higher in energy than $S_{1f}$ and $S_{1F}$ and so it may transfer to $S_{1T}$ and then to $S_{1F}$ from which light hv (F) may be emitted as delayed fluorescence.

A pathway for decay of triplet excitons on $T_{1T}$ in competition with triplet-triplet annihilation a non-radiative (quenching) pathway to $S_{0T}$, illustrated by a dotted line between $T_{1T}$ and $S_{0T}$. A number of measures may be taken to maximise the probability of TTA rather than decay to $S_{0T}$, in particular:

i) The TTA promoter may be selected such that triplet excitons on $T_{1T}$ have a relatively long lifetime τ. A relatively long lifetime not only means that the rate of decay to $S_{OT}$ is relatively slow but also that the likelihood of TTA is relatively high.

ii) Two or more TTA promoter units may be provided in close proximity.

Each of these measures may be used alone or in combination.

Figure 3:
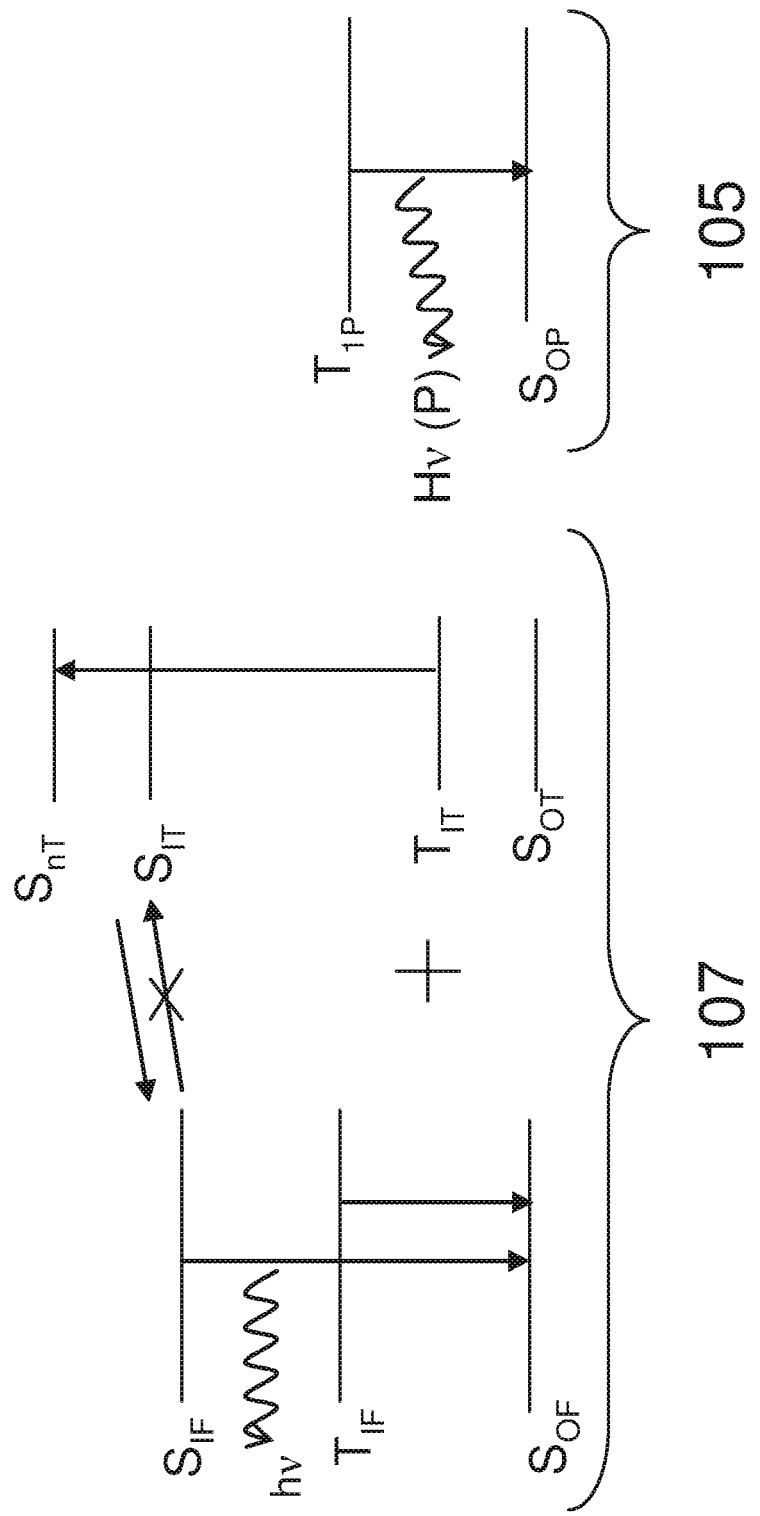
FIG. 3 illustrates a second triplet-triplet annihilation mechanism for a device according to an embodiment of the invention.

FIG. 3 illustrates a second energy transfer wherein triplet-triplet annihilation occurs between the triplet exciton of energy $T_{1T}$ located on the TTA promoter and the triplet exciton of energy $T_{1F}$ located on the fluorescent light-emitting material. It will be appreciated that this results in a triplet-triplet annihilated singlet exciton having an energy of up to $T_{1F}+T_{1T}$. This singlet exciton is higher in energy than $S_{1F}$ and so it may transfer its energy to $S_{1F}$ from which light hv may be emitted as delayed fluorescence.

In FIGS. 2 and 3, although it may be preferable for energy level $S_{1T}$ to be greater than $S_{1E}$, it will be appreciated that this is not essential in order for triplet absorption to occur.

By utilising a TTA promoter to generate TTA and produce stable, delayed fluorescence it is possible to improve efficiency as compared to a device in which there is no TTA promoter.

In FIGS. 2 and 3, TTA has been described with respect to TTA promoter—TTA promoter triplet annihilation and TTA promoter—fluorescent emitter material triplet annihilation mechanisms respectively, however it will be appreciated that it is possible for both mechanisms to operate in the same device, and that the amount of delayed fluorescence from each of these two mechanisms will depend on factors such as the concentration of fluorescent light emitting material, the concentration of TTA promoter and the excited state lifetime of triplet excitons on the light emitting unit and the TTA promoter unit. Measures described above with reference to FIG. 2 may be employed to increase the probability of TTA.

The fluorescent light-emitting material and the TTA promoter may be selected such that the rate constant of transfer of triplet excitons from the fluorescent light-emitting material to the TTA promoter may be selected so as to be greater than the rate constant of quenching of triplet excitons by the TTA promoter.

Light emitted from the fluorescent light-emitting layer of devices of the invention may include delayed fluorescence as described above, as well as fluorescence arising directly from recombination of holes and electrons on the light-emitting material ("prompt fluorescence").

The skilled person will be aware of methods to determine the presence of delayed fluorescence in light emitted from a light-emitting composition, for example by measuring light emission from a light-emitting composition following prompt fluorescence.

Time resolved electroluminescent spectra may be taken during turn-off of an exemplary device; where TTA occurs, after turn-off of the current an initial rapid decay of the luminance on a similar timescale to the RC time constant of the device is followed by a residual signal in emission decays in a period of typically a few microseconds. Generally slow transient emissions in OLEDs are ascribed to either the recombination of charges from deep traps or interfacial charge layers or TTA (see Kondakov, D. Y. Characterization of triplet-triplet annihilation in organic light-emitting diodes based on anthracene derivatives. *J. Appl. Phys.* 102, 114504-5 (2007), Sinha, S., Rothe, C., Guentner, R., Scherf, U. & Monkman, A. P. Electrophosphorescence and Delayed Electroluminescence from Pristine Polyfluorene Thin Film Devices at Low Temperature. *Physical Review Letters* 90, 127402 (2003), and Sinha, S., Monkman, A. P., Guntner, R. & Scherf, U. Space-charge-mediated delayed electroluminescence from polyfluorene thin films. *Appl. Phys. Lett.* 82, 4693-4695 (2003)).

In order to distinguish between the two mechanisms the same transient electroluminescence trace may been measured with the application of a 10 v reverse bias pulse 100 ns after the turn off of the device current, this pulse will remove, or at least perturb significantly, any trapped charge contribution to the decay of the luminance. If the decay of luminscence after the reverse bias pulse is unchanged compared to the standard decay shape then it may be concluded that the recombination of trapped charge is not a significant contributor to the residual luminance signal but is rather due to delayed fluorescence arising from TTA (Popovic, Z. D. & Aziz, H. Delayed electroluminescence in small-molecule-based organic light-emitting diodes: Evidence for triplet-triplet annihilation and recombination-center-mediated light-generation mechanism. *J. Appl. Phys.* 98, 013510-5 (2005)).

The phosphorescent light-emitting layer 105 adjacent to the fluorescent light-emitting layer 107 contains a phosphorescent light-emitting material having a triplet excited state energy level $T_{1P}$, as illustrated in FIGS. 2 and 3. The phosphorescent light-emitting material is capable of producing phosphorescent emission hv (P) by decay of triplet excitons from $T_{1P}$ to ground state $S_{0P}$. The $T_{1P}$ energy level may be higher than $T_{1T}$ in adjacent fluorescent light-emitting layer 105.

The $T_{1F}$ energy level of the fluorescent light-emitting material may be no more than 0.1 eV below, optionally the same as or higher than, the $T_{1P}$ energy level of the phosphorescent material of layer 105.

Triplet energy levels may be measured by low temperature phosphorescence spectroscopy (Y. V. Romaovskii et al, *Physical Review Letters*, 2000, 85 (5), p 1027, A. van Dijken et al, *Journal of the American Chemical Society*, 2004, 126, p 7718).

Singlet energy levels may be measured by fluorescence spectroscopy.

Fluorescent Light Emitting Materials

Suitable fluorescent light-emitting materials include small molecule, polymeric and dendrimeric materials, and compositions thereof. Suitable light-emitting polymers include poly(arylene vinylenes) such as poly(p-phenylene vinylenes) and polyarylenes such as: polyfluorenes, particularly 2,7-linked 9,9 dialkyl polyfluorenes or 2,7-linked 9,9 diaryl polyfluorenes; polyspirofluorenes, particularly 2,7-linked poly-9,9-spirofluorene; polyindenofluorenes, particularly 2,7-linked polyindenofluorenes; polyphenylenes, particularly alkyl or alkoxy substituted poly-1,4-phenylene. Such polymers as disclosed in, for example, Adv. Mater. 2000 12(23) 1737-1750 and references therein.

The fluorescent light-emitting material is preferably blue fluorescent material having a peak photoluminescence wavelength less than or equal to 480 nm, such as in the range of 400-480 nm.

A fluorescent light-emitting polymer may be a light-emitting homopolymer comprising light-emitting repeat units, or it may be a copolymer comprising light-emitting repeat units and further repeat units such as hole transporting and/or electron transporting repeat units as disclosed in, for example, WO 00/55927. Each repeat unit may be provided in a main chain or side chain of the polymer.

A fluorescent light-emitting polymer may have a non-conjugated backbone with conjugated groups pendant from the non-conjugated backbone, or may be a polymer having a backbone containing repeat units that are conjugated to one another.

Exemplary repeat units of a conjugated fluorescent light-emitting homopolymer or copolymer may include one or more of arylene, heteroarylene, vinylene and arylenevinylene (for example phenylenevinylene) and arylamine repeat units. Each repeat unit may be unsubstituted or substituted with one or more substituents. Where present, substituents may be selected from $C_{1-40}$ hydrocarbyl groups.

Conjugated polymers preferably comprise repeat units having arylene or heteroarylene groups that are conjugated to arylene or heteroarylene groups of adjacent repeat units. The extent of conjugation across a repeat unit, that is the degree of conjugation between repeat units adjacent units either side of a repeat unit, may be controlled, for example to control singlet and/or triplet energy levels.

Exemplary fluorene repeat units have formula (I):

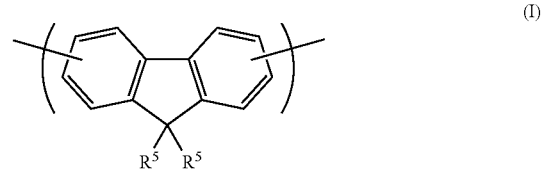

wherein $R^5$ in each occurrence is the same or different and is H or a substituent, and wherein the two groups $R^5$ may be linked to form a ring.

Each $R^5$ is preferably a substituent, and each $R^5$ may independently be selected from the group consisting of:
  substituted or unsubstituted alkyl, optionally $C_{1-20}$ alkyl, wherein one or more non-adjacent C atoms may be replaced with optionally substituted aryl or heteroaryl, O, S, substituted N, C=O or —COO— and one or more H atoms may be replaced with F;
  substituted or unsubstituted aryl or heteroaryl group, or a linear or branched chain of aryl or heteroaryl groups, each of which may independently be substituted, for example a group of formula —$(Ar^4)_r$ wherein $Ar^4$ in each occurrence independently is a substituted or unsubstituted aryl or heteroaryl group and r is at least 1, optionally 1, 2 or 3;
  a crosslinkable group attached directly to the fluorene unit or spaced apart therefrom by a spacer group, for example a group comprising a double bond such and a vinyl or acrylate group, or a benzocyclobutane group In the case where $R^5$ comprises one or more aryl or heteroaryl groups $Ar^4$, each $Ar^4$ may independently be substituted with one or more substituents $R^6$ selected from the group consisting of:

alkyl, for example $C_{1-20}$ alkyl, wherein one or more non-adjacent C atoms may be replaced with O, S, substituted N, C=O and —COO— and one or more H atoms of the alkyl group may be replaced with F or aryl or heteroaryl optionally substituted with one or more groups $R^7$, aryl or heteroaryl optionally substituted with one or more groups $R^7$, $NR^8{}_2$, $OR^8$, $SR^8$, and fluorine, nitro and cyano;

wherein each $R^7$ is independently alkyl, for example $C_{1-20}$ alkyl, in which one or more non-adjacent C atoms may be replaced with O, S, substituted N, C=O and —COO— and one or more H atoms of the alkyl group may be replaced with F or D; and each $R^8$ is independently selected from the group consisting of alkyl, for example $C_{1-20}$ alkyl, and aryl or heteroaryl optionally substituted with one or more alkyl groups, for example phenyl that is unsubstituted or substituted with one or more $C_{1-20}$ alkyl groups.

The aromatic carbon atoms of the fluorene repeat unit may all be unsubstituted, or one or more of these aromatic carbon atoms may be substituted with a substituent $R^4$. Where present, each $R^4$ is independently selected from the group consisting of alkyl, for example $C_{1-20}$ alkyl, wherein one or more non-adjacent C atoms may be replaced with O, S, NH or substituted N, C=O and —COO—, optionally substituted aryl, optionally substituted heteroaryl, alkoxy, alkylthio, fluorine, cyano and arylalkyl. Particularly preferred substituents $R^4$ include $C_{1-20}$ alkyl and substituted or unsubstituted aryl, for example phenyl. Optional substituents for the aryl include one or more $C_{1-20}$ alkyl groups.

Where present, substituted N may independently in each occurrence be $NR^9$ wherein $R^9$ is alkyl, optionally $C_{1-20}$ alkyl, or optionally substituted aryl or heteroaryl. Optional substituents for aryl or heteroaryl $R^9$ may be selected from $R^7$ or $R^8$.

Preferably, each $R^5$ is selected from the group consisting of $C_{1-20}$ alkyl and —($Ar^4$), wherein $Ar^4$ in each occurrence is substituted or unsubstituted substituted phenyl. Optional substituents for phenyl include one or more $C_{1-20}$ alkyl groups.

The repeat unit of formula (I) may be a 2,7-linked repeat unit of formula (Ia):

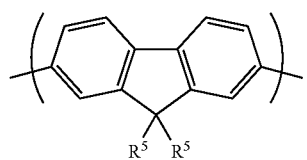

(Ia)

Optionally, the repeat unit of formula (Ia) is not substituted by a substituent $R^4$ in a position adjacent to the 2- or 7-positions.

The extent of conjugation of repeat units of formula (I) to adjacent repeat units may be limited by (a) linking the repeat unit through the 3- and/or 6-positions to limit the extent of conjugation across the repeat unit, and/or (b) substituting the repeat unit with one or more further substituents $R^4$ in or more positions adjacent to the linking positions in order to create a twist with the adjacent repeat unit or units, for example a 2,7-linked fluorene carrying a $C_{1-20}$ alkyl substituent in one or both of the 3- and 6-positions.

Exemplary phenylene-containing repeat units have formula (II):

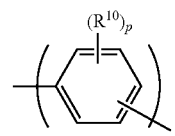

(II)

wherein p is 0, 1, 2, 3 or 4, optionally 1 or 2; q is 1, 2 or 3; and $R^{10}$ independently in each occurrence is a substituent, optionally a substituent $R^5$ as described above with reference to formula (I), for example $C_{1-20}$ alkyl, and phenyl that is unsubstituted or substituted with one or more $C_{1-20}$ alkyl groups.

In the case where q=1, the repeat unit of formula (II) may be 1,4-linked, 1,2-linked or 1,3-linked.

If the repeat unit of formula (II) is 1,4-linked and if p is 0 then the extent of conjugation of repeat unit of formula (II) may be relatively high.

If p is at least 1, and/or the repeat unit is 1,2- or 1,3 linked, then the extent of conjugation of repeat unit of formula (II) may be relatively low. In one optional arrangement, q=1, the repeat unit of formula (II) is 1,3-linked and p is 0, 1, 2 or 3. In another optional arrangement, the repeat unit of formula (II) has formula (IIa):

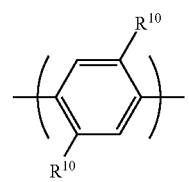

(IIa)

Another exemplary arylene repeat unit has formula (III):

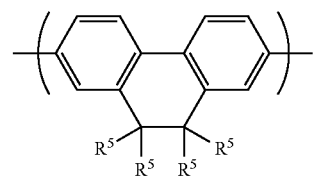

(III)

wherein $R^5$ is as described with reference to formula (I) above. Each of the $R^5$ groups may be linked to any other of the $R^5$ groups to form a ring.

Further arylene co-repeat units include: phenanthrene repeat units; naphthalene repeat units; anthracene repeat units; and perylene repeat units. Each of these arylene repeat units may be linked to adjacent repeat units through any two of the aromatic carbon atoms of these units. Specific exemplary linkages include 9,10-anthracene; 2,6-anthracene; 1,4-naphthalene; 2,6-naphthalene; 2,7-phenanthrene; and 2,5-perylene. Each of these repeat units may be unsubstituted or substituted with one or more substituents. Preferred substituents are selected from $C_{1-40}$ hydrocarbyl, for example $C_{1-20}$ alkyl and phenyl that is unsubstituted or substituted with one or more $C_{1-20}$ alkyl groups.

The polymer may contain amine repeat units in particular amines of formula (IV):

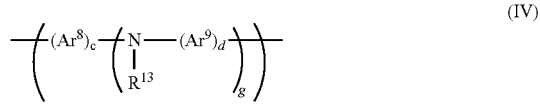

(IV)

wherein $Ar^8$ and $Ar^9$ in each occurrence are independently selected from substituted or unsubstituted aryl or heteroaryl, g is greater than or equal to 1, preferably 1 or 2, $R^{13}$ is H or a substituent, preferably a substituent, and c and d are each independently 1, 2 or 3. $R^{13}$, which may be the same or different in each occurrence when g>1, is preferably selected from the group consisting of alkyl, for example $C_{1-20}$ alkyl, $Ar^{10}$, a branched or linear chain of $Ar^{10}$ groups, or a crosslinkable unit that is bound directly to the N atom of formula (IV) or spaced apart therefrom by a spacer group, wherein $Ar^{10}$ in each occurrence is independently optionally substituted aryl or heteroaryl. Exemplary spacer groups are $C_{1-20}$ alkyl, phenyl and phenyl-$C_{1-20}$ alkyl.

Any of $Ar^8$, $Ar^9$ and, if present, $Ar^{10}$ in the repeat unit of Formula (IV) may be linked by a direct bond or a divalent linking atom or group to another of $Ar^8$, $Ar^9$ and $Ar^{10}$. Preferred divalent linking atoms and groups include O, S; substituted N; and substituted C.

Any of $Ar^8$, $Ar^9$ and, if present, $Ar^{10}$ may be substituted with one or more substituents. Exemplary substituents are substituents $R^{14}$, wherein each $R^{14}$ may independently be selected from the group consisting of:

substituted or unsubstituted alkyl, optionally $C_{1-20}$ alkyl, wherein one or more non-adjacent C atoms may be replaced with optionally substituted aryl or heteroaryl, O, S, substituted N, C=O or —COO— and one or more H atoms may be replaced with F; and a crosslinkable group attached directly to $Ar^8$, $Ar^9$ or $Ar^{10}$ or spaced apart therefrom by a spacer group, for example a group comprising a double bond such and a vinyl or acrylate group, or a benzocyclobutane group.

Substituted N, where present, may be N substituted with a hydrocarbyl group, for example a $C_{1-10}$ alkyl, unsubstituted phenyl or phenyl substituted with one or more $C_{1-10}$ alkyl groups.

Preferred repeat units of formula (IV) have formulae 1-3:

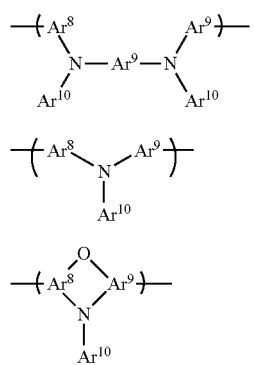

In one preferred arrangement, $R^{13}$ is $Ar^{10}$ and each of $Ar^8$, $Ar^9$ and $Ar^{10}$ are independently and optionally substituted with one or more $C_{1-20}$ alkyl groups.

$Ar^8$, $Ar^9$ and $Ar^{10}$ are preferably phenyl, each of which may independently be substituted with one or more substituents as described above.

In another preferred arrangement, $Ar^8$ and $Ar^9$ are phenyl, each of which may be substituted with one or more $C_{1-20}$ alkyl groups, and $R^{13}$ is 3,5-diphenylbenzene wherein each phenyl may be substituted with one or more $C_{1-20}$ alkyl groups.

In another preferred arrangement, c, d and g are each 1 and $Ar^8$ and $Ar^9$ are phenyl linked by an oxygen atom to form a phenoxazine ring.

Amine repeat units may be provided in a molar amount in the range of about 0.5 mol % up to about 50 mol %, optionally about 1-25 mol %, optionally about 1-10 mol %.

Repeat units of formula (IV) may provide hole-transporting and/or light-emitting properties. A conjugated polymer may contain one, two or more different repeat units of formula (IV), for example a first repeat unit of formula (IV) to provide hole-transport and a second repeat unit of formula (IV) to provide light-emission.

A fluorescent light-emitting copolymer may comprise light-emitting repeat units and at least one of repeat units for providing hole-transport and repeat units for providing electron transport. Amine repeat units of formula (IV) may provide light-emission and hole transport. Electron transport may be provided by conjugated chains of arylene repeat units, for example chains of fluorene repeat units of formula (I).

The fluorescent light-emitting layer may consist of the light-emitting polymer and the TTA promoter alone, alone or may comprise these materials in combination with one or more further materials. For example, the light-emitting polymer may be blended with hole and/or electron transporting materials or alternatively may be covalently bound to hole and/or electron transporting materials as disclosed in for example, WO 99/48160.

TTA Promoter

The TTA promoter may be a compound that is chemically unbound to, but physically mixed with, the fluorescent light-emitting material. Further materials, such as one or more charge-transporting materials (e.g. one or both of hole transporting and electron transporting materials) may also be present in the fluorescent light-emitting layer. Alternatively, the TTA promoter unit may be bound, in particular covalently bound, to the light-emitting material or another component of the composition directly or through a spacer group.

Where the light-emitting material is a conjugated polymer comprising light-emitting repeat units and further repeat units, for example light-emitting amine repeat units of formula (IV) and arylene repeat units such as repeat units of formula (I) or (II), conjugation of the TTA promoter into the polymer main chain (for example by conjugation with fluorene repeat units) may reduce the $T_1$ energy level of the TTA promoter, thus increasing the energetic favourability of triplet exciton transfer from the emitter unit to the TTA promoter unit. This reduction in $T_1$ energy level of the TTA promoter may also enable use of the TTA promoter with light-emitting materials with $T_1$ levels that are too low for use with a TTA promoter that is not conjugated in this way.

In the case where the TTA promoter is blended with the light-emitting material, the TTA promoter may be a small molecule compound or a polymer.

$S_1$ and $T_1$ energy levels of organic compounds are disclosed in, for example, Dekker, Handbook of Photophysics 2nd Edition (1993). Suitable TTA promoters for use with a given fluorescent light-emitting material may be selected based on the listed $S_1$ and $T_1$ energy levels of these organic compounds.

Exemplary TTA promoter compounds include aromatic or heteroaromatic compounds comprising one or more mono- or polycyclic rings, and optionally including one or more alkenyl or alkynyl groups, for example polyaromatic hydrocarbons such as anthracenes, perylenes and anthanthrenes and derivatives thereof; distyryl aryls and derivatives thereof such as distyrylbenzenes, distyrylbiphenyls, stilbenes, fulvenes, dibenzofulvenes, linear polyenes (from 2 to 6 alkenes) including cyclic polyenes such as cyclooctatetraene.

Any of these compounds may optionally be substituted, for example substituted with one or more solubilising groups such as $C_{1-20}$ alkyl, and may be provided as a component of a larger structure, for example as a repeat unit of a polymer.

Further materials having appropriate singlet and triplet photophysical properties are described in Handbook of Photochemistry, $2^{nd}$ Edition, Steven L Murov, Ian Carmichael and Gordon L Hug, the contents of which are incorporated herein by reference, each of which compound may optionally be substituted, for example substituted with alkyl groups.

A TTA promoter polymer blended with the light-emitting material, or a polymer containing repeat units of a fluorescent light-emitting material and a TTA promoter, preferably contains repeat units of formula (V):

-(PAH)- (V)

wherein PAH represents a polyaromatic hydrocarbon that may be unsubstituted or substituted with one or more substituents. Particularly preferred substituents are selected from $C_{1-40}$ hydrocarbyl, preferably $C_{1-20}$ alkyl. Hydrocarbyl substituents such as alkyl substituents may provide solubility in non-polar organic solvents such as mono- and polyalkylated benzene.

Exemplary polyaromatic hydrocarbons PAH include anthracene, perylene and anthanthrene.

A TTA promoter polymer blended with the light-emitting material may contain repeat units of formula (V) and one or more co-repeat units. Exemplary co-repeat units include fluorene repeat units of formula (I) and phenylene repeat units of formula (II).

A particularly preferred polyaromatic repeat unit is anthracene of formula (Va):

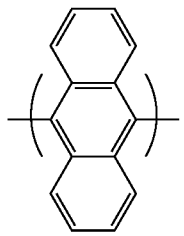

(Va)

The anthracene repeat unit may be unsubstituted or substituted, for example substituted with one or more $C_{1-20}$ alkyl groups.

The TTA promoter may be provided as end-groups or side-groups of a polymer.

A side-group may be incorporated into a light-emitting polymer by providing it as a substituent of a monomer as illustrated below:

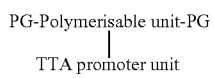

PG-Polymerisable unit-PG
|
TTA promoter unit wherein PG represents a polymerisable group such as a leaving group as described above, or a polymerisable double bond. The polymerisable unit may be an aromatic or heteroaromatic unit, for example a fluorene or phenylene unit of formula (I) or (II), and the TTA promoter unit may be directly bound to the polymerisable unit or spaced apart therefrom by a spacer chain, for example a $C_{1-20}$ alkyl chain in which one or more non-adjacent C atoms may be replaced with O.

In order to increase the probability of TTA and delayed fluorescence as described above, the TTA promoter may contain a plurality of TTA promoter units provided in close proximity. For example, two such units may be provided in an optionally substituted material having the general formula (VI):

TTPU-Spacer-TTPU (VI)

wherein "TTPU" represents a TTA promoter unit and the spacer is a conjugated or non-conjugated spacer group. An exemplary conjugated spacer comprises one or more aryl units, for example optionally substituted phenyl or fluorene. An exemplary non-conjugated spacer is $C_{1-10}$ alkyl. The material of formula (VI) may be a separate compound physically mixed with the fluorescent light-emitting material or it may be bound to the light-emitting material. In the case where the light-emitting material is a polymer, the unit of formula (VI) may be bound as a main-chain repeat unit, a side group or an end-group as described above.

Although binding of the TTA promoter to the fluorescent light-emitting material is described above, it will be appreciated that the TTA promoter may be bound to any other component of the composition, where present, in the same way. For example, the composition may comprise one or more of a hole transporting and electron transporting material in which case the TTA promoter may be bound to either or both of these units in addition to or as an alternative to binding of the TTA promoter to the fluorescent light-emitting material.

The concentration of the TTA promoter, either blended with or bound to the fluorescent light-emitting material, is optionally in the range of 0.1-20 mol %, optionally 0.1-10 mol %, optionally 0.1-5 mol % relative to the light emitting material. A higher concentration of the TTA promoter may increase the probability of TTA.

In order to increase the probability of TTA, the half-life of excited state triplets residing on the TTA promoter is optionally at least 1 microsecond, optionally at least 10 microseconds, optionally at least 100 microseconds. The half-life of a triplet exciton may be measured by flash photolysis to measure monomolecular triplet lifetime as described in Handbook of Photochemistry, $2^{nd}$ Edition, Steven L Murov, Ian Carmichael and Gordon L Hug and references therein, the contents of which are incorporated herein by reference.

It will be appreciated that, unlike phosphorescent dopants such as heavy metal complexes, the TTA promoter does not provide an energetically favourable pathway for absorbed triplets to undergo radiative decay, and as a result substantially none of the energy of the triplet exciton absorbed by the TTA promoter is lost from the TTA promoter in the form of phosphorescent light emission from the TTA promoter.

Phosphorescent Light-Emitting Materials

OLEDs according to embodiments of the invention contain a phosphorescent light-emitting layer adjacent to the fluorescent light-emitting layer, and may contain one or more further phosphorescent light-emitting layers.

Exemplary phosphorescent light-emitting materials for use in phosphorescent light-emitting layers include metal complexes comprising substituted or unsubstituted complexes of formula (VII):

$$ML^1_q L^2_r L^3_s \quad \text{(VII)}$$

wherein M is a metal; each of $L^1$, $L^2$ and $L^3$ is a coordinating group; q is an integer; r and s are each independently 0 or an integer; and the sum of (a·q)+(b·r)+(c·s) is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet or higher states. Suitable heavy metals M include d-block metals, in particular those in rows 2 and 3 i.e. elements 39 to 48 and 72 to 80, in particular ruthenium, rhodium, palladium, rhenium, osmium, iridium, platinum and gold. Iridium is particularly preferred.

Exemplary ligands $L^1$, $L^2$ and $L^3$ include carbon or nitrogen donors such as porphyrin or bidentate ligands of formula (VIII):

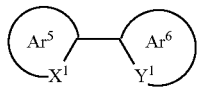

wherein $Ar^5$ and $Ar^6$ may be the same or different and are independently selected from substituted or unsubstituted aryl or heteroaryl; $X^1$ and $Y^1$ may be the same or different and are independently selected from carbon or nitrogen; and $Ar^5$ and $Ar^6$ may be fused together. Ligands wherein $X^1$ is carbon and $Y^1$ is nitrogen are preferred, in particular ligands in which $Ar^5$ is a single ring or fused heteroaromatic of N and C atoms only, for example pyridyl or isoquinoline, and $Ar^6$ is a single ring or fused aromatic, for example phenyl or naphthyl.

Examples of bidentate ligands are illustrated below:

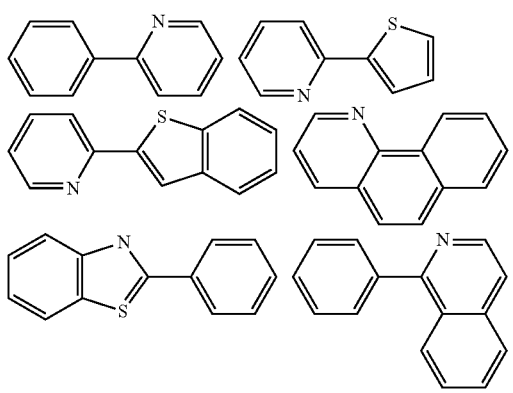

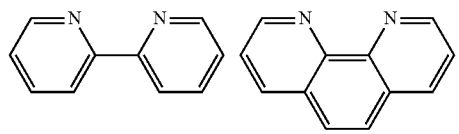

Each of $Ar^5$ and $Ar^6$ may carry one or more substituents. Two or more of these substituents may be linked to form a ring, for example an aromatic ring.

Other ligands suitable for use with d-block elements include diketonates, in particular acetylacetonate (acac); triarylphosphines and pyridine, each of which may be substituted.

Other ligands suitable for use with d-block elements include diketonates, in particular acetylacetonate (acac); triarylphosphines and pyridine, each of which may be substituted, for example substituted with one or more $C_{1-20}$ alkyl.

Exemplary substituents for ligands of compounds of formula (VII) include groups $R^5$ as described above with reference to Formula (I). Particularly preferred substituents include fluorine or trifluoromethyl which may be used to blue-shift the emission of the complex, for example as disclosed in WO 02/45466, WO 02/44189, US 2002-117662 and US 2002-182441; alkyl or alkoxy groups, for example $C_{1-20}$ alkyl or alkoxy, which may be as disclosed in JP 2002-324679; carbazole which may be used to assist hole transport to the complex when used as an emissive material, for example as disclosed in WO 02/81448; and dendrons which may be used to obtain or enhance solution processability of the metal complex, for example as disclosed in WO 02/66552. Preferably, the phosphorescent compound of formula (VII) is substituted with at least one dendron.

A light-emitting dendrimer typically comprises a light-emitting core bound to one or more dendrons, wherein each dendron comprises a branching point and two or more dendritic branches. Preferably, the dendron is at least partially conjugated, and at least one of the branching points and dendritic branches comprises an aryl or heteroaryl group, for example a phenyl group. In one arrangement, the branching point group and the branching groups are all phenyl, and each phenyl may independently be substituted with one or more substituents, for example alkyl or alkoxy.

A dendron may have optionally substituted formula (IX)

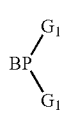

(IX)

wherein BP represents a branching point for attachment to a core and $G_1$ represents first generation branching groups.

The dendron may be a first, second, third or higher generation dendron. $G_1$ may be substituted with two or more second generation branching groups $G_2$, and so on, as in optionally substituted formula (IXa):

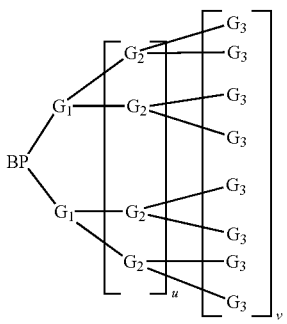

(IXa)

wherein u is 0 or 1; v is 0 if u is 0 or may be 0 or 1 if u is 1; BP represents a branching point for attachment to a core and $G_1$, $G_2$ and $G_3$ represent first, second and third generation dendron branching groups. In one preferred embodiment, each of BP and $G_1$, $G_2$ ... $G_n$ is phenyl, and each phenyl BP, $G_1$, $G_2$ ... $G_{n-1}$ is a 3,5-linked phenyl. In another preferred embodiment, BP is triazine and $G_1$, $G_2$ ... $G_{n-1}$ is a 3,5-linked phenyl.

Preferred dendrons include substituted or unsubstituted dendrons of formulae (IXb) and (IXc):

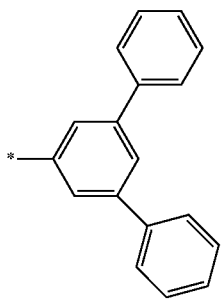

(IXb)

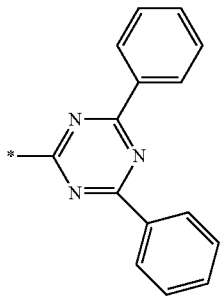

(IXc)

wherein * represents an attachment point of the dendron to a core.

BP and/or any group G may be substituted with one or more substituents, for example one or more $C_{1-20}$ alkyl or alkoxy groups.

Exemplary phosphorescent red emitters include fac-tris (1-phenylisoquinoline)iridium(III), which may be substituted with one or more substituents, for example as described above with reference to Formula (VII).

Exemplary phosphorescent green emitters include fac-tris (2-phenylpyridine)iridium(III), which may be substituted with one or more substituents as described above with reference to Formula (VII).

Phosphorescent light-emitting layers may contain one or more phosphorescent light-emitting materials and a host material. Where present, the host material may be physically mixed with a phosphorescent material or may be chemically bound thereto. In the case of a polymeric host, the phosphorescent material(s) may be provided in a side-chain, main chain or end-group of a polymer. Where a phosphorescent material is provided in a polymer side-chain, the phosphorescent material may be directly bound to the backbone of the polymer or spaced apart therefrom by a spacer group, for example a $C_{1-20}$ alkyl spacer group in which one or more non-adjacent C atoms may be replaced by O or S.

The phosphorescent material may be provided in the side-chain, main chain or end-group of a host polymer by providing the phosphorescent material with one or two reactive polymerisable groups capable of reacting with the reactive groups of the other monomers used to form the polymer. In the case of a metal complex phosphorescent material of formula (VII) comprising one or more ligands of formula (VIII), the reactive groups may be provided as substituents on one or more of $Ar^4$ and/or $Ar^5$. In another arrangement, $Ar^4$ and/or $Ar^5$ may be substituted, for example substituted with phenyl, and the substituent may in turn be substituted with one or more reactive groups for binding to the host polymer or polymerization into the host polymer main chain.

This binding may result in more efficient transfer of excitons from the host polymer to the phosphorescent material because it may provide intramolecular exciton transfer pathways unavailable to a corresponding mixed system.

Moreover, binding may be beneficial for processing reasons. For example, if the light emitting dopant has low solubility then binding it to a soluble polymer allows the light emitting dopant to be carried in solution by the charge transporting material, enabling device fabrication using solution processing techniques. Furthermore, binding the light emitting dopant to the polymer may prevent phase separation effects in solution-processed devices that may be detrimental to device performance.

The host material preferably has a triplet excited state energy level that is at least the same as or higher than that of the phosphorescent material it is doped with. Preferably, the gap between the host and phosphorescent material excited state energy levels is at least kT in order to avoid back transfer of excitons from the phosphorescent material to the host material. The host material is optionally solution processable.

A phosphorescent light-emitting material may be present in a light-emitting layer in an amount of about 0.05 mol % up to about 20 mol %, optionally about 0.1-10 mol % relative to its host material.

Suitable hosts for green or red phosphorescent materials include optionally substituted diaryltriazines or triaryltriazines. Triazine-containing host materials are described in more detail in WO 2008/025997 and include, for example, optionally substituted triphenyltriazine. Optional substituents of the phenyl groups of triphenyltriazine include one or more alkyl groups, for example $C_{1-20}$ alkyl groups. The host may be a polymer comprising triazine repeat units, in particular an optionally substituted di- or tri-aryltriazine repeat unit attached as a side group through one of the aryl groups, or a repeat unit attached in the polymer main chain through two of the aryl groups. A host polymer comprising triazine repeat units may comprise further repeat units selected from (hetero)arylene co-repeat units, such as phenyl, fluorene or indenofluorene repeat units as described above, wherein each of said (hetero)arylene repeat units may optionally be substituted with one or more substituents such as alkyl or alkoxy groups. One class of co-repeat units is fluorene repeat units of formula (I) as described above.

The host polymer may contain repeat units of formula (X):

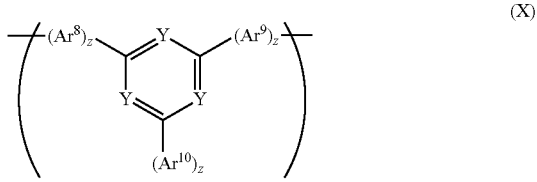

wherein $Ar^8$, $Ar^9$ and $Ar^{10}$ are as described with reference to formula (IV) above, and may each independently be substituted with one or more substituents described with reference to $Ar^8$, $Ar^9$ and $Ar^{10}$, z in each occurrence is independently at least 1, optionally 1, 2 or 3, preferably 1, and Y is N or $CR^{14}$, wherein $R^{14}$ is H or a substituent, preferably H or $C_{1-10}$ alkyl. Preferably, $Ar^8$, $Ar^9$ and $Ar^{10}$ of formula (X) are each phenyl, each phenyl being optionally and independently substituted with one or more $C_{1-20}$ alkyl groups.

In one preferred embodiment, all 3 groups Y are N.

If all 3 groups Y are $CR^{14}$ then at least one of $Ar^8$, $Ar^9$ and $Ar^{10}$ is preferably a heteroaromatic group comprising N.

Each of $Ar^8$, $Ar^9$ and $Ar^{10}$ may independently be substituted with one or more substituents. In one arrangement, $Ar^8$, $Ar^9$ and $Ar^{10}$ are phenyl in each occurrence. Exemplary substituents include $R^5$ as described above with reference to formula (I), for example $C_{1-20}$ alkyl or alkoxy.

Preferably, each z is 1 and each of $Ar^8$, $Ar^9$ and $Ar^{10}$ is unsubstituted phenyl or phenyl substituted with one or more $C_{1-20}$ alkyl groups.

A particularly preferred repeat unit of formula (X) has formula (Xa), which may be unsubstituted or substituted with or more substituents $R^5$, preferably one or more $C_{1-20}$ alkyl groups:

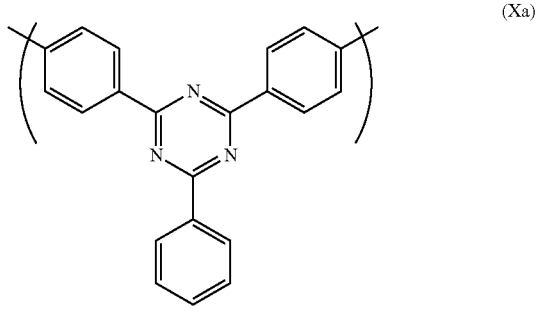

A host polymer comprising aromatic repeat units may form conjugated chains of aromatic units. The extent of conjugation of this chain may be interrupted or reduced by inclusion of suitable repeat units in the polymer backbone, such as repeat units that form a twist in the polymer backbone and repeat units that limit or break conjugation.

Exemplary repeat units that may limit conjugation of a conjugated host polymer include:
1,4-phenylene repeat units of formula (II) wherein p is at least 1;
1,2- or 1,3-phenylene repeat units of formula (II) wherein p is 0, 1, 2, 3 or 4;
3,6-fluorene repeat units of formula (I);

The host polymer may contain conjugation-breaking repeat units that break any conjugation path between repeat units adjacent to the conjugation-breaking repeat unit. Exemplary conjugation-breaking repeat units have formula (XI):

wherein $Ar^1$ in each occurrence independently represents a substituted or unsubstituted aryl or heteroaryl group; and $Sp^1$ represents a spacer group that does not provide any conjugation path between the two groups $Ar^1$. $Ar^1$ may be phenyl. $Sp^1$ may be a $C_{1-10}$ alkyl chain. $Ar^1$ may be unsubstituted, or substituted with one or more substituents $R^5$ as described with reference to formula (I).

Polymer Synthesis

Preferred methods for preparation of conjugated polymers as described above, including host polymers, fluorescent light-emitting polymers, phosphorescent light-emitting polymers and TTA promoter polymers, comprise a "metal insertion" wherein the metal atom of a metal complex catalyst is inserted between an aryl or heteroaryl group and a leaving group of a monomer. Exemplary metal insertion methods are Suzuki polymerisation as described in, for example, WO 00/53656 and Yamamoto polymerisation as described in, for example, T. Yamamoto, "Electrically Conducting And Thermally Stable π-Conjugated Poly(arylene)s Prepared by Organometallic Processes", Progress in Polymer Science 1993, 17, 1153-1205. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units illustrated throughout this application may be derived from a monomer carrying suitable leaving groups. Likewise, an end group or side group may be bound to the polymer by reaction of a suitable leaving group.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include tosylate, mesylate and triflate.

Device Patterning

The light-emitting layers of OLEDs of the invention may be patterned or unpatterned. A device having unpatterned light-emitting layers may be used an illumination source, for example. A white light emitting device is particularly suitable for this purpose. A device comprising a patterned layer may be, for example, an active matrix display or a passive matrix display. In the case of an active matrix display, light-emitting layers may be used in combination with a patterned anode layer and an unpatterned cathode. In the case of a passive matrix display, the anode layer is formed of parallel stripes of anode material, and parallel stripes of light-emitting material and cathode material arranged perpendicular to the anode material wherein the stripes of light emitting material and cathode material may be separated by stripes of insulating material ("cathode separators") formed by photolithography.

Charge Transporting and Charge Blocking Layers

A hole transporting layer may be provided between the anode and the light-emitting layer or layers. Likewise, an electron transporting layer may be provided between the cathode and the light-emitting layer or layers.

Similarly, an electron blocking layer may be provided between the anode and the light-emitting layer and a hole blocking layer may be provided between the cathode and the light-emitting layer. Transporting and blocking layers may be used in combination. Depending on its HOMO and LUMO levels, a single layer may both transport one of holes and electrons and block the other of holes and electrons.

If present, a hole transporting layer located between the anode and the light-emitting layers preferably has a HOMO level of less than or equal to 5.5 eV, more preferably around 4.8-5.5 eV or 5.1-5.3 eV as measured by cyclic voltammetry. The HOMO level of the hole transport layer may be selected so as to be within 0.2 eV, optionally within 0.1 eV, of an adjacent layer (such as a light-emitting layer) in order to provide a small barrier to hole transport between these layers.

If present, an electron transporting layer located between the light-emitting layers and cathode preferably has a LUMO level of around 2.5-3.5 eV as measured by cyclic voltammetry. For example, a layer of a silicon monoxide or silicon dioxide or other thin dielectric layer having thickness in the range of 0.2-2 nm may be provided between the light-emitting layer nearest the cathode and the cathode.

A hole transporting layer may contain a homopolymer or copolymer comprising amine repeat units of formula (IV) as described above, preferably a copolymer comprising repeat units of formula (IV) and arylene repeat units, for example arylene repeat units selected from one or more repeat units of formulae (I), (II) and (III).

An electron transporting layer may contain a polymer comprising a chain of optionally substituted arylene repeat units, such as a chain of fluorene repeat units.

HOMO and LUMO levels may be measured by cyclic voltammetry (CV) wherein the working electrode potential is ramped linearly versus time.

When cyclic voltammetry reaches a set potential the working electrode's potential ramp is inverted. This inversion can happen multiple times during a single experiment. The current at the working electrode is plotted versus the applied voltage to give the cyclic voltammogram trace.

Apparatus to measure HOMO or LUMO energy levels by CV may comprise a cell containing a tert-butyl ammonium perchlorate/or tertbutyl ammonium hexafluorophosphate solution in acetonitrile, a glassy carbon working electrode where the sample is coated as a film, a platinum counter electrode (donor or acceptor of electrons) and a reference glass electrode no leak Ag/AgCl. Ferrocene is added in the cell at the end of the experiment for calculation purposes. (Measurement of the difference of potential between Ag/AgCl/ferrocene and sample/ferrocene).

Method and Settings:
3 mm diameter glassy carbon working electrode
Ag/AgCl/no leak reference electrode
Pt wire auxiliary electrode
0.1 M tetrabutylammonium hexafluorophosphate in acetonitrile LUMO=4.8−ferrocene (peak to peak maximum average)+onset
Sample: 1 drop of 5 mg/mL in toluene spun @3000 rpm
LUMO (reduction) measurement:
A good reversible reduction event is typically observed for thick films measured at 200 mV/s and a switching potential of −2.5V. The reduction events should be measured and compared over 10 cycles, usually measurements are taken on the $3^{rd}$ cycle. The onset is taken at the intersection of lines of best fit at the steepest part of the reduction event and the baseline.

Hole Injection Layers

A conductive hole injection layer, which may be formed from a conductive organic or inorganic material, may be provided between the anode and the light-emitting layer or layers of an OLED to improve hole injection from the anode into the layer or layers of semiconducting polymer. Examples of doped organic hole injection materials include optionally substituted, doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and optionally substituted polythiophene or poly(thienothiophene). Examples of conductive inorganic materials include transition metal oxides such as VOx MoOx and RuOx as disclosed in Journal of Physics D: Applied Physics (1996), 29(11), 2750-2753.

Cathode

The cathode is selected from materials that have a workfunction allowing injection of electrons into the light-emitting layer. Other factors influence the selection of the cathode such as the possibility of adverse interactions between the cathode and the light-emitting material. The cathode may consist of a single layer of a conductive material such as a layer of aluminium. Alternatively, it may comprise a plurality of materials, for example a bilayer of a low workfunction material and a high workfunction material such as calcium and aluminium as disclosed in WO 98/10621; elemental barium as disclosed in WO 98/57381, Appl. Phys. Lett. 2002, 81(4), 634 and WO 02/84759; or a thin layer of metal compound, in particular an oxide or fluoride of an alkali or alkali earth metal, provided between the organic layer or layers of the OLED and one or more conductive layers to assist electron injection, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a layer having a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise one or more plastic layers, for example a substrate of alternating plastic and dielectric barrier layers or a laminate of thin glass and plastic.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Solution Processing

Common organic solvents, including mono- or polyalkylbenzenes such as toluene and xylene, may be used to deposit materials used to form charge-transporting or light-emitting layers of an OLED. The materials may form a formulation for deposition with one or more solvents, and the formulation may be a solution or dispersion containing the materials to be deposited. A single solvent or mixture of two or more solvents may be used.

Particularly preferred solution deposition techniques including printing and coating techniques such spin-coating and inkjet printing. Other solution deposition techniques include dip-coating, roll printing and screen printing.

During OLED formation, formation of an organic layer on an underlying organic layer may be arranged such that the underlying layer is not dissolved by the solvent or solvents used to deposit the overlying layer.

Methods for prevent dissolution of an underlying organic layer include crosslinking of the underlying layer prior to deposition of the following organic layer and use of a solvent or solvent mixture that dissolves the materials of the overlying organic layer but does not dissolve the materials of the underlying organic layer.

In the case of crosslinking, layers that may be crosslinked include a hole-transporting layer prior to formation by solution processing of an overlying light-emitting layer, or crosslinking of one light-emitting layer prior to formation by solution processing of another, overlying light-emitting layer.

Suitable crosslinkable groups include groups comprising a reactive double bond such and a vinyl or acrylate group, or a benzocyclobutane group. Where a layer to be crosslinked contains a polymer, the crosslinkable groups may be provided as substituents of repeat units of the polymer.

Coating methods such as spin-coating are particularly suitable for devices wherein patterning of the light-emitting layer is unnecessary—for example for lighting applications or simple monochrome segmented displays.

Printing methods such as inkjet printing are particularly suitable for high information content displays, in particular full colour displays. A device may be inkjet printed by providing a patterned layer over the first electrode and defining wells for printing of one colour (in the case of a monochrome device) or multiple colours (in the case of a multicolour, in particular full colour device). The patterned layer is typically a layer of photoresist that is patterned to define wells as described in, for example, EP 0880303. All organic layers, including light-emitting, charge injecting and charge-transporting layers, may be formed by successive printing the materials for each layer into wells.

As an alternative to wells, the ink may be printed into channels defined within a patterned layer. In particular, the photoresist may be patterned to form channels which, unlike wells, extend over a plurality of pixels and which may be closed or open at the channel ends.

EXAMPLES

General Device Process

A device having the following structure was prepared:
ITO/HIL/HTL/Green/Red/Blue/Cathode
wherein ITO is an indium-tin oxide anode; HIL is a hole-injecting layer comprising a hole-injecting material; HTL is a hole-transporting layer; and Green, Red and Blue are green, red and blue light-emitting layers, respectively.

A substrate carrying ITO was cleaned using UV/Ozone. A 15 nm thick hole injection layer was formed by spin-coating an aqueous formulation of a hole-injection material available from Plextronics, Inc. A hole transporting layer was formed to a thickness of 20 nm by spin-coating Hole-Transporting Polymer 1 and crosslinking the polymer by heating. A green light-emitting layer was formed was formed to a thickness of 30 nm by spin-coating and cross-linking Green Light-Emitting Polymer 1. A red light-emitting layer was formed was formed to a thickness of 22 nm by spin-coating and crosslinking Red Light-Emitting Polymer 1. A blue light-emitting layer was formed was formed to a thickness of 50 nm by spin-coating a composition of a blue light-emitting polymer and TTA Promoter Polymer 1. A cathode was formed by evaporation of a first layer of a metal fluoride to a thickness of about 2 nm, a second layer of aluminium to a thickness of about 100 nm and a third layer of silver to a thickness of about 100 nm The polymers used for the hole-transporting layer and light-emitting layers were each formed by Suzuki polymerisation as described in WO 00/53656 of the monomers described below.

Hole-Transporting Polymer 1

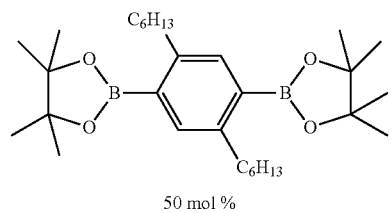

50 mol %

-continued
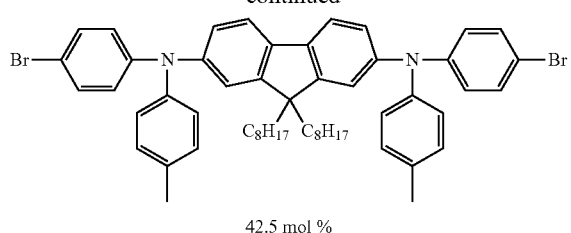
42.5 mol %
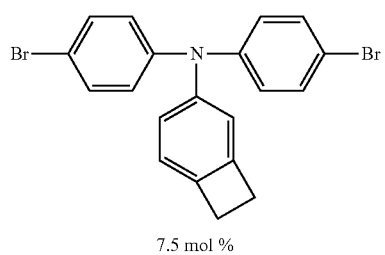
7.5 mol %
Green Light-Emitting Polymer 1
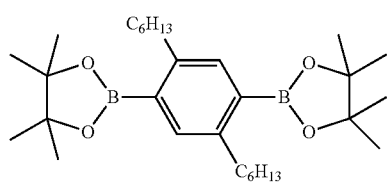
50 mol %
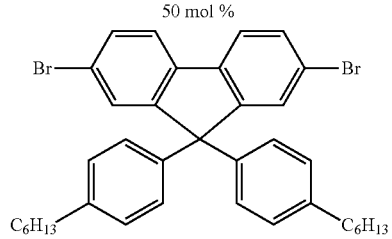
20.7 mol %
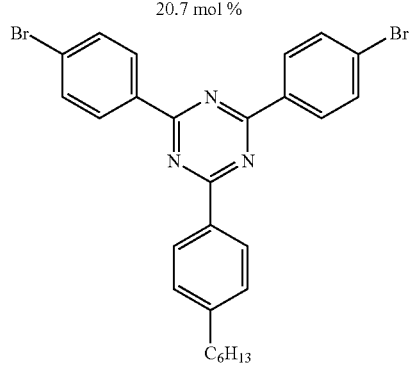
11.5 mol %
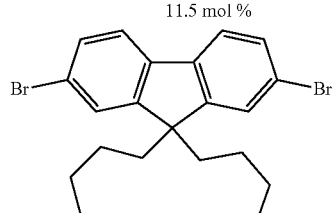
5 mol %
-continued
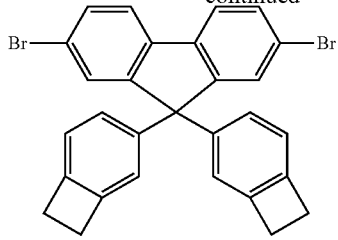
5 mol %
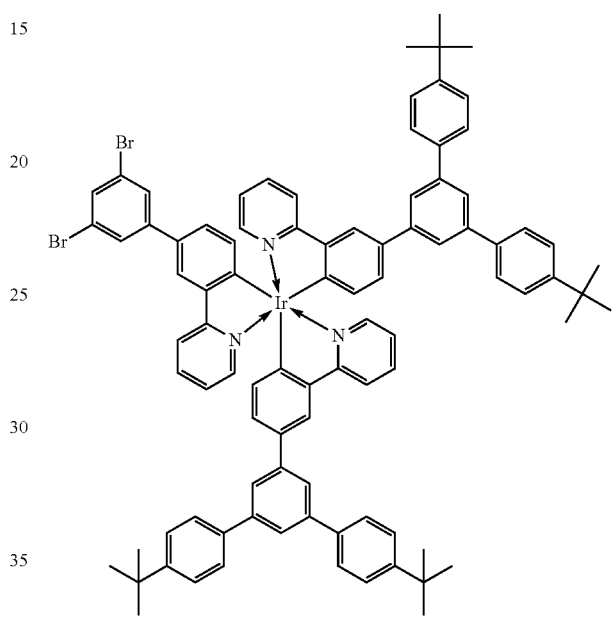
7.8 mol %
Red Light-Emitting Polymer 1
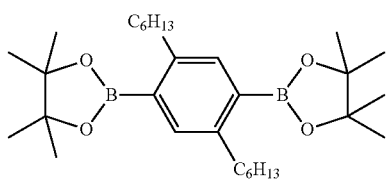
50 mol %
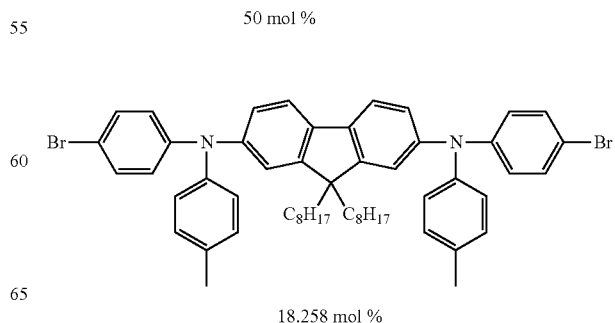
18.258 mol %

-continued
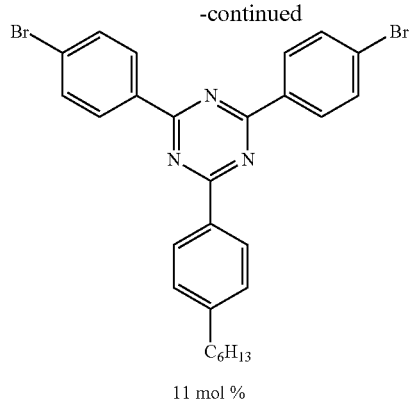
11 mol %
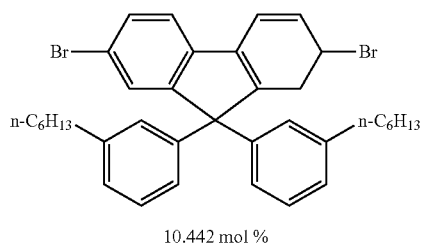
10.442 mol %
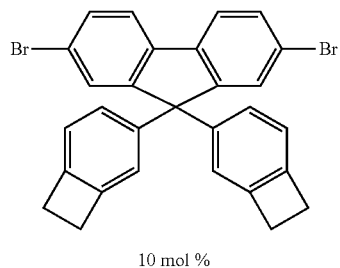
10 mol %
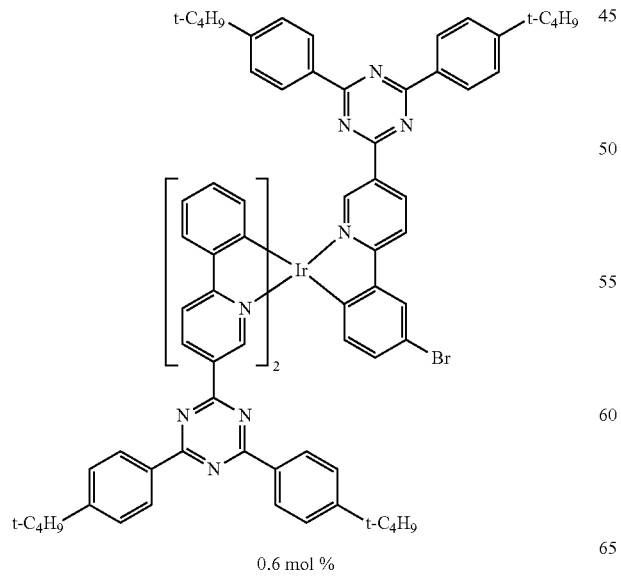
0.6 mol %
Blue Light-Emitting Polymer 1
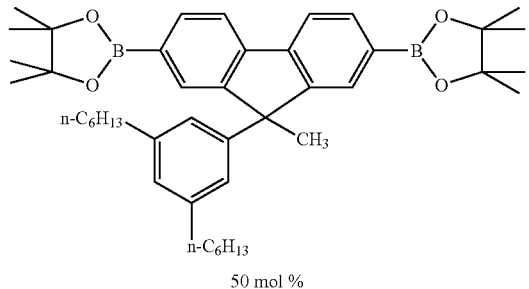
50 mol %
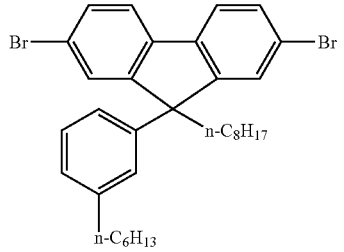
44 mol %
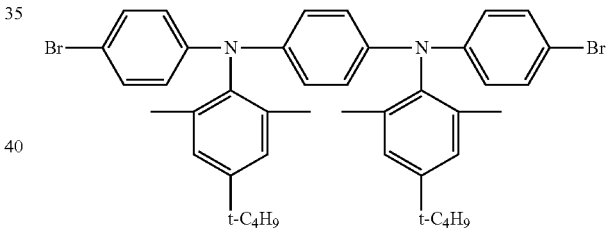
5 mol %
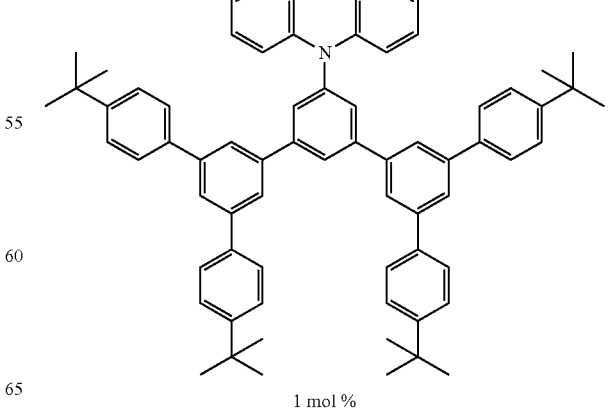
1 mol %

Blue Light-Emitting Polymer 2

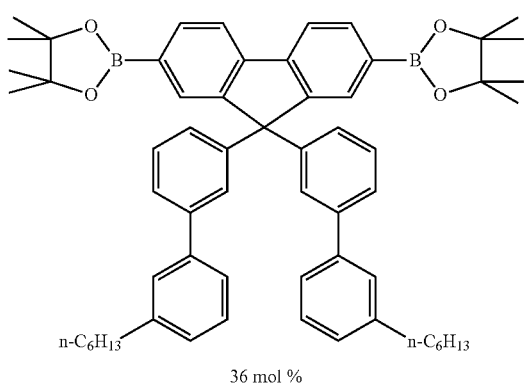

36 mol %

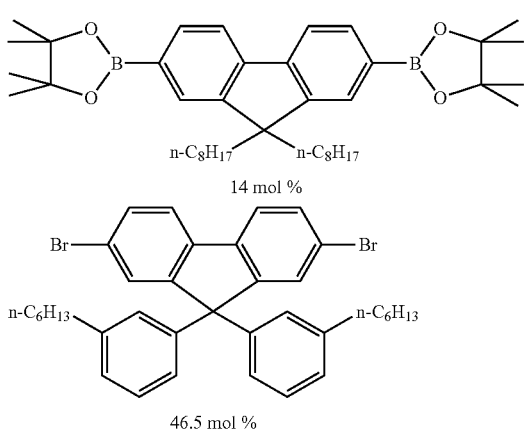

14 mol %

46.5 mol %

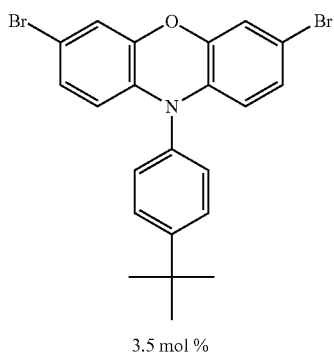

3.5 mol %

TTA Promoter Polymer 1

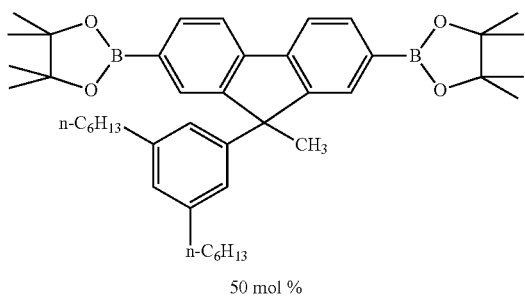

50 mol %

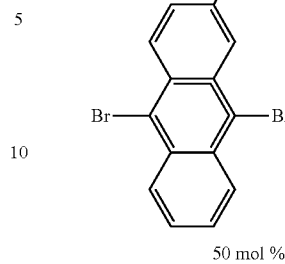

50 mol %

Device Example 1

A device was prepared as described according to the General Device Process wherein the blue light-emitting polymer was Blue Light-Emitting Polymer 1, and wherein the Blue Light-Emitting Polymer 1:TTA Promoter Polymer 1 molar ratio was 99:1.

Comparative Device 1

A device was prepared according to Device Example 1 except that the blue light-emitting layer was formed by spin-coating Blue Light-Emitting Polymer 1 only, without TTA Promoter Polymer 1.

Figure 4:
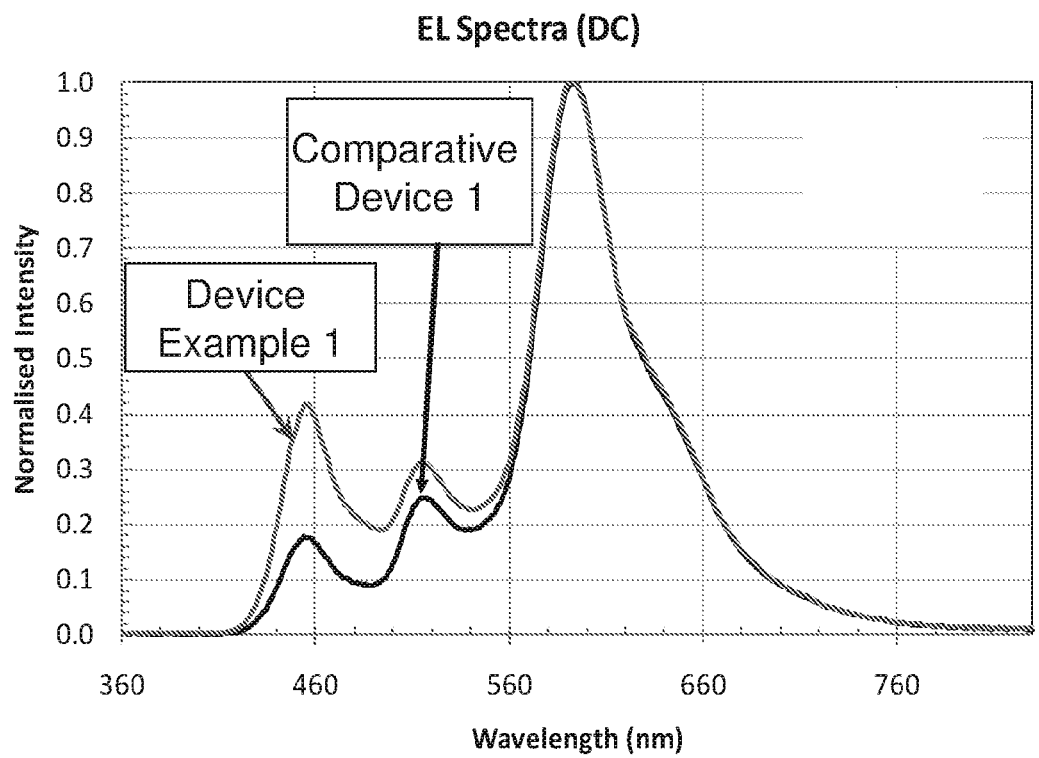
FIG. 4 is electroluminescent spectra of a first device according to an embodiment of the invention and a first comparative device.

With reference to FIG. 4, the intensity of blue emission relative to red emission is much greater in Device Example 1 than in Comparative Device 1. Relative intensity of green emission is also higher.

With reference to Table 1, both CIE x and y co-ordinate values of Device Example 1 are lower than those of Comparative Device 1, and closer to "pure" white emission having co-ordinates of (0.33, 0.33); the colour rendering index is higher; the correlated colour temperature is higher; and the Duv distance from the blackbody locus is smaller.

TABLE 1

| Device | CIE x | CIE y | Colour Rendering Index | Correlated Colour Temperature | Duv |
|---|---|---|---|---|---|
| Comparative Device 1 | 0.494 | 0.401 | 57.9 | 2515 | 0.014 |
| Device Example 1 | 0.443 | 0.366 | 66.2 | 2944 | 0.02 |

Figure 5:
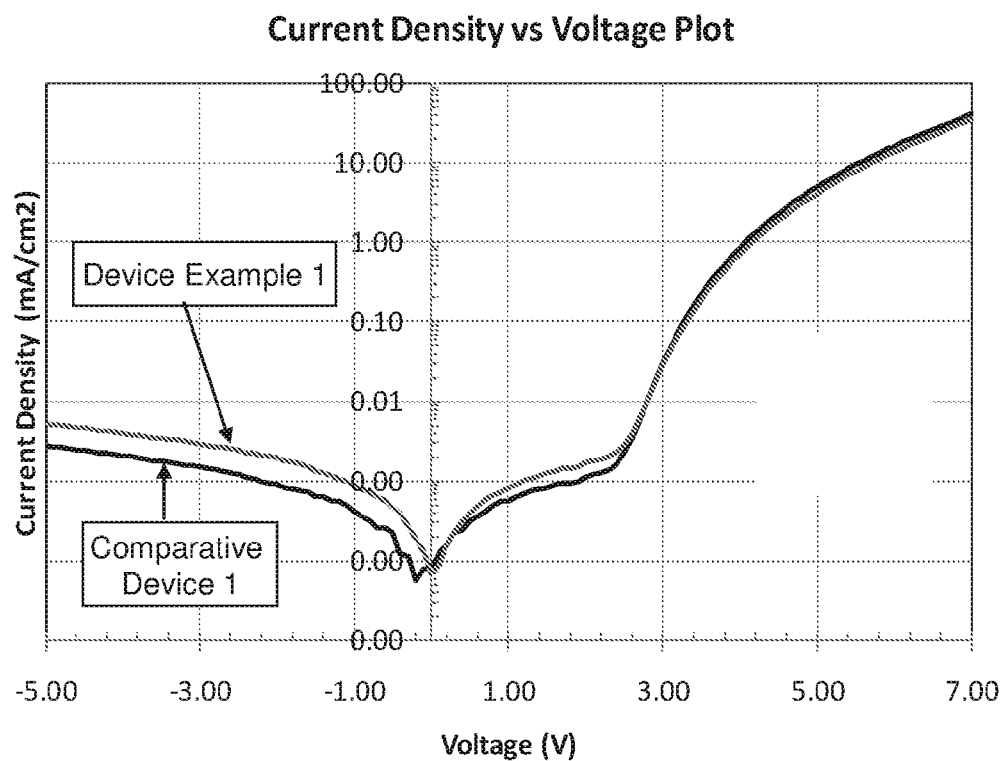
FIG. 5 is a graph of current density vs. voltage for the first device according to an embodiment of the invention and the first comparative device.
Figure 6:
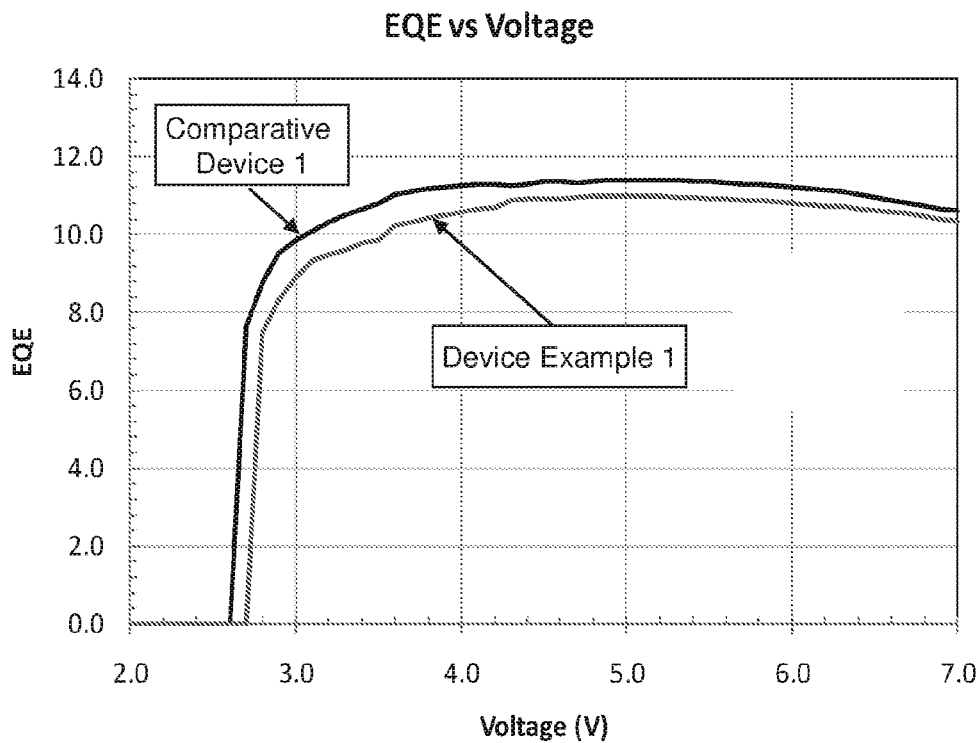
FIG. 6 is a graph of external quantum efficiency vs. voltage for the first device according to an embodiment of the invention and the first comparative device.

With reference to FIG. 5 and FIG. 6, conductivity and external quantum efficiency respectively of Device Example 1 and Comparative Device 1 are similar.

Figure 7:
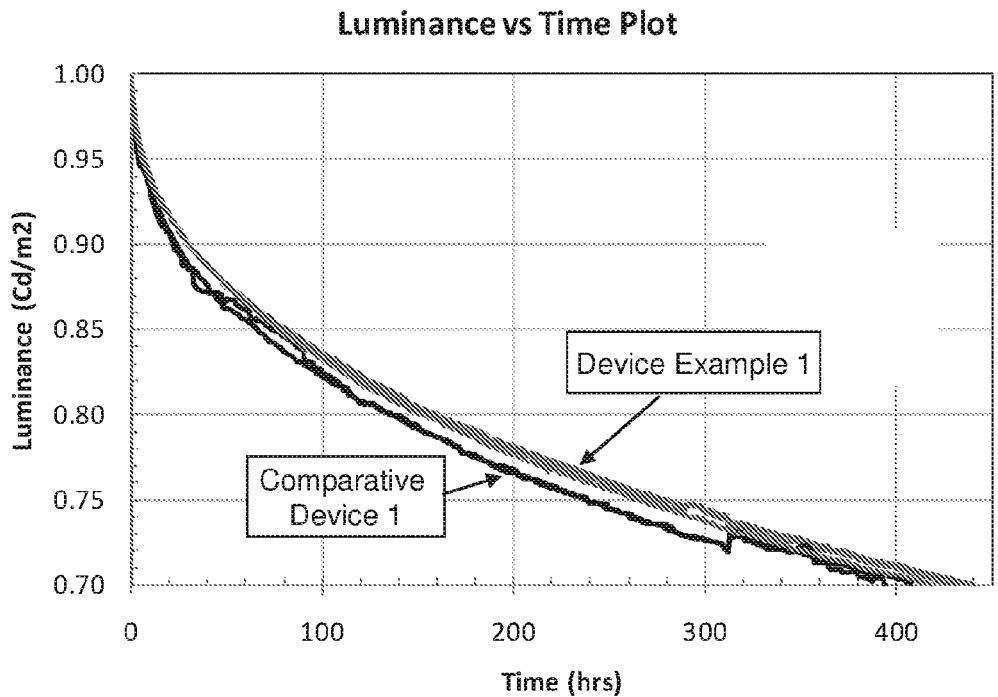
FIG. 7 is a graph of luminance vs. time for the first device according to an embodiment of the invention and the first comparative device.

With reference to FIG. 7, T70 values for Device Example 1 and Comparative Device 1 from a starting luminance of 2000 cd/m2 are similar. T70 is the time taken for brightness to fall to 70% of a starting luminance at constant current.

Without wishing to be bound by any theory, it is believed that the presence of a TTA promoter in the blue light-emitting layer allows for triplet-triplet annihilation in the blue light-emitting layer, improving efficiency of emission from the blue light-emitting polymer. Triplets consumed in triplet-triplet annihilation do not diffuse into the adjacent phosphorescent red light-emitting layer and contribute to red emission, which may again reduce the ratio of blue:red emission.

TTA Promoter Polymer 1 is in a layer adjacent to the red phosphorescent layer. Surprisingly, substantial quenching of red emission by the TTA promoter is not observed. Without wishing to be bound by any theory, it is believed that the relatively low amount of the TTA promoter minimises the probability of any such quenching.

Device Example 2

A device was prepared as described according to the General Device Process wherein the blue light-emitting polymer was Blue Light-Emitting Polymer 2, and wherein the Blue Light-Emitting Polymer 2:TTA Promoter Polymer 1 molar ratio was 99:1.

Comparative Device 2

A device was prepared according to Device Example 2 except that the blue light-emitting layer was formed by spin-coating Blue Light-Emitting Polymer 2 only, without TTA Promoter Polymer 1.

Figure 8:
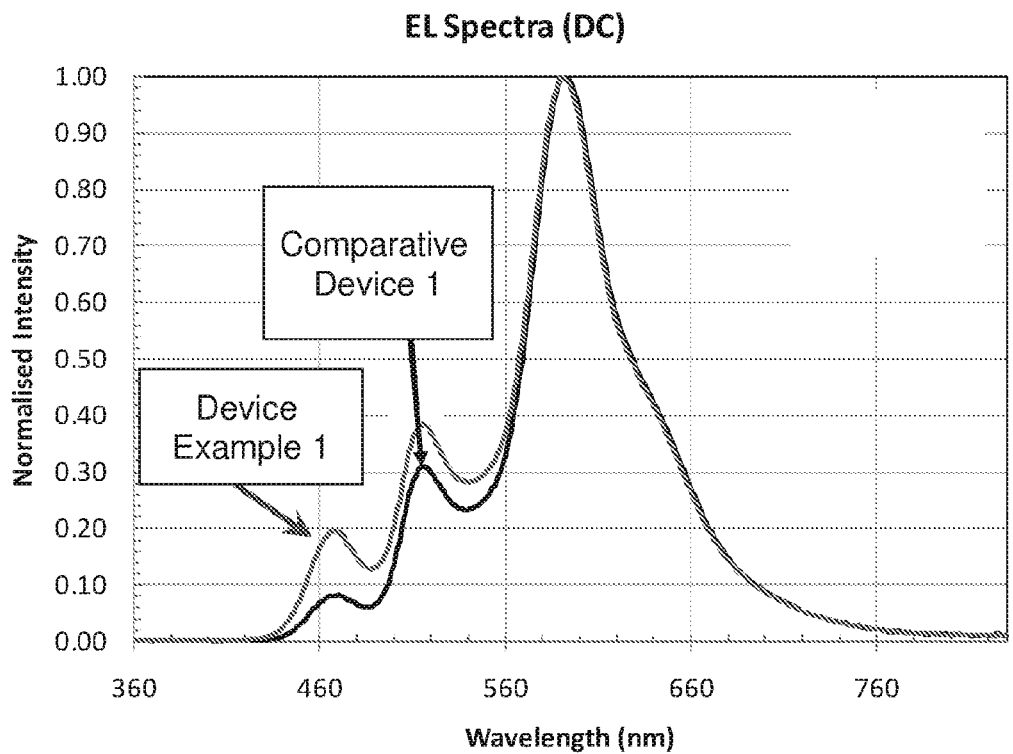
FIG. 8 is electroluminescent spectra of a second device according to an embodiment of the invention and a second comparative device.

With reference to FIG. 8, the intensity of blue emission relative to red emission is much greater in Device Example 2 than in Comparative Device 2. Relative intensity of green emission is also higher.

With reference to Table 2, both CIE x and y co-ordinate values of Device Example 1 are lower than those of Comparative Device 1, and closer to "pure" white emission having co-ordinates of (0.33, 0.33); the colour rendering index is higher; and the correlated colour temperature is higher.

TABLE 2

| Device | CIE x | CIE y | Colour Rendering Index | Correlated Colour Temperature |
|---|---|---|---|---|
| Comparative Device 1 | 0.512 | 0.442 | 57.5 | 2221 |
| Device Example 1 | 0.479 | 0.432 | 64.7 | 2566 |

Figure 9:
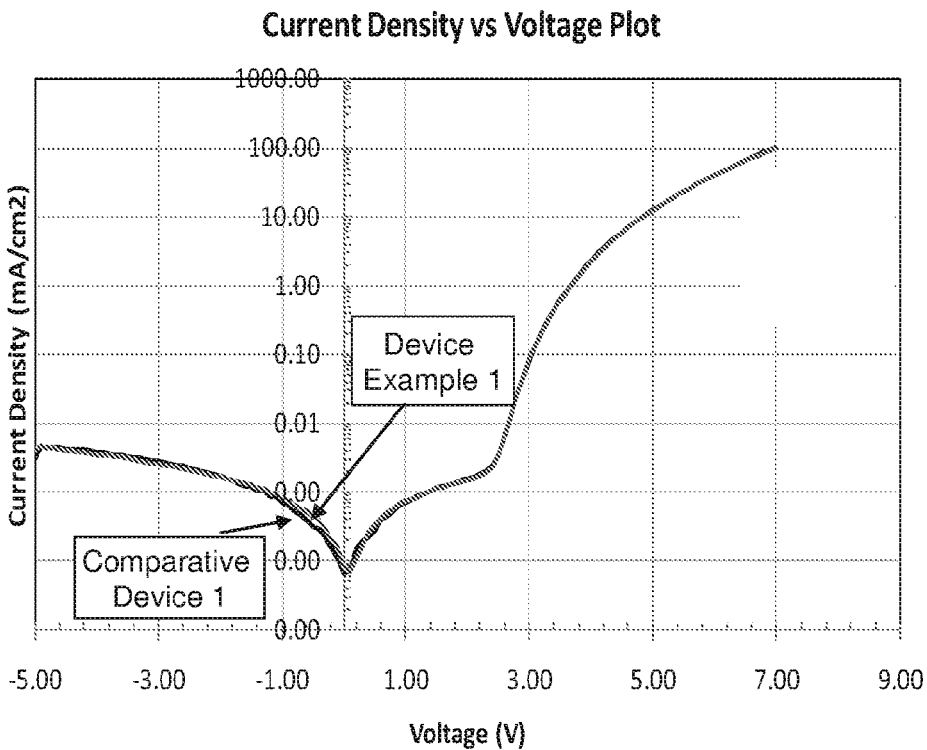
FIG. 9 is a graph of current density vs. voltage for the second device according to an embodiment of the invention and the second comparative device.
Figure 10:
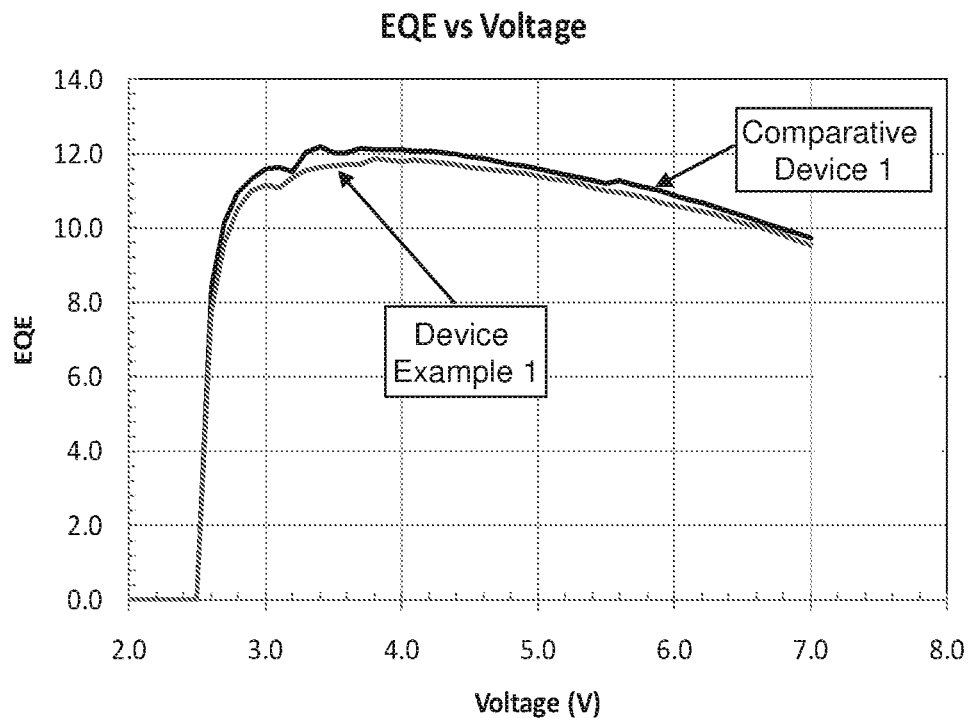
FIG. 10 is a graph of external quantum efficiency vs. voltage for the second device according to an embodiment of the invention and the second comparative device.

With reference to FIG. 9 and FIG. 10, conductivity and external quantum efficiency respectively of Device Example 2 and Comparative Device 2 are similar.

Figure 11:
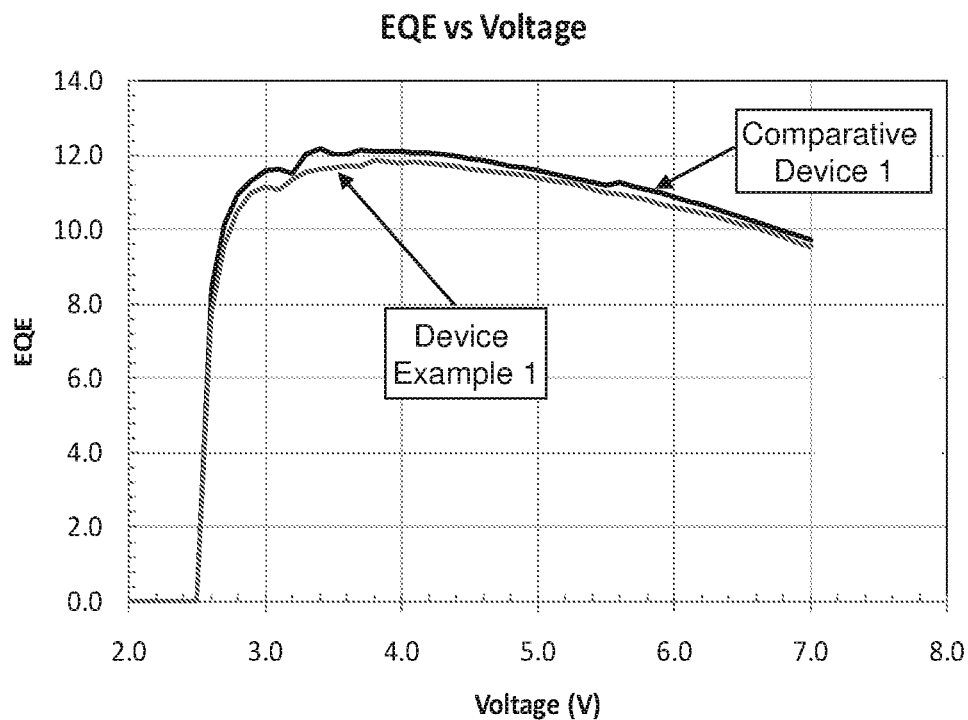
FIG. 11 is a graph of luminance vs. time for the second device according to an embodiment of the invention and the second comparative device.

With reference to FIG. 11, T70 values for Device Example 2 and Comparative Device 2 from a starting luminance of 2000 cd/m2 are similar.

Device Example 3

A device was prepared as described in Device Example 2 except that the Blue Light-Emitting Polymer 2:TTA Promoter Polymer 1 molar ratio was 98:2.

Device Example 4

A device was prepared as described in Device Example 2 except that the Blue Light-Emitting Polymer 2:TTA Promoter Polymer 1 molar ratio was 94:6.

Device Example 5

A device was prepared as described in Device Example 2 except that the Blue Light-Emitting Polymer 2:TTA Promoter Polymer 1 molar ratio was 90:10.

Figure 12:
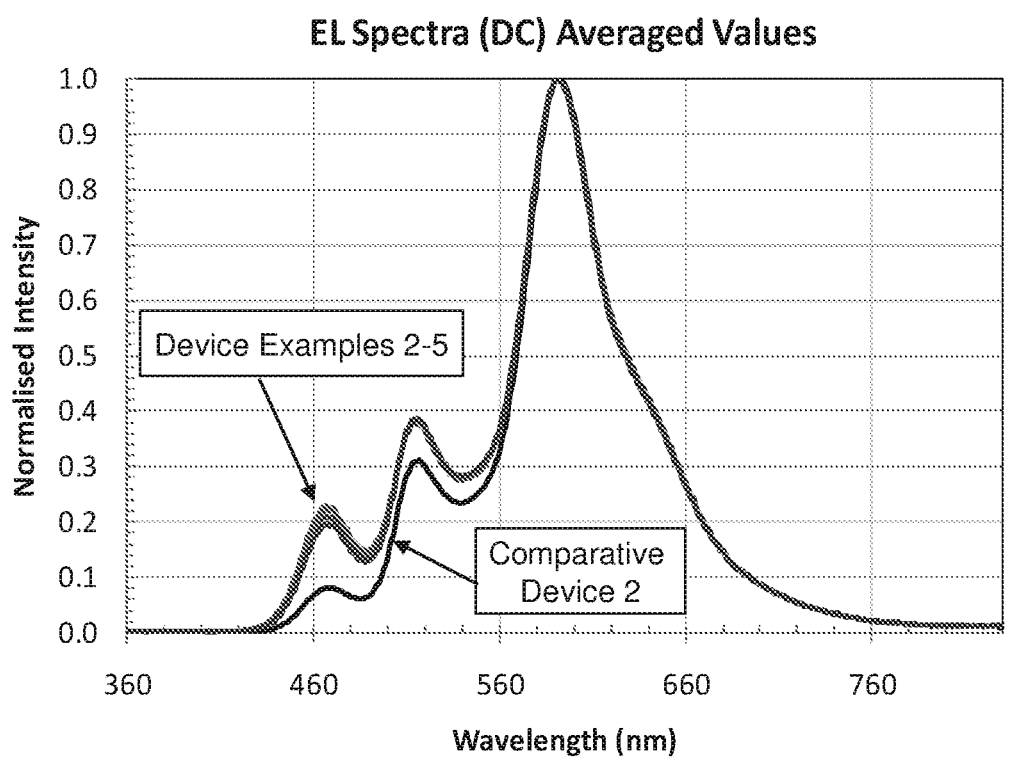
FIG. 12 is electroluminescent spectra of second, third, fourth and fifth devices according to embodiments of the invention and the second comparative device.

With reference to the electroluminescent spectra of FIG. 12, it can be seen that there is little or no colour difference between Device Examples 2-5, in which the blue fluorescent polymer:TTA promoter polymer molar ratio varies between 99:1 and 90:10.

With reference to Table 3, it can be seen that efficiency falls slightly with increase of the molar ratio of the TTA promoter polymer 1 (TTAP). Without wishing to be bound by any theory, it is believed that increasing the amount of the TTA promoter in the blue fluorescent light-emitting layer increases probability of quenching of phosphorescence in the adjacent red phosphorescent layer.

TABLE 3

| Example | Blue:TTAP molar ratio | V | Voltage at 10 mA | External quantum efficiency (%) | Efficiency (lm/W) | Efficiency (cd/A) |
|---|---|---|---|---|---|---|
| Device Example 5 | 90:10 | 4.43 | 5.06 | 10.9 | 18.4 | 26 |
| Device Example 4 | 94:6 | 4.35 | 4.98 | 11.3 | 19.4 | 27 |
| Device Example 3 | 98:2 | 4.33 | 4.98 | 11.9 | 20.7 | 28 |
| Device Example 2 | 99:1 | 4.21 | 4.83 | 11.8 | 21.3 | 29 |
| Comparative Device 2 | 100:0 | 4.19 | 4.82 | 12.1 | 21.7 | 29 |

With reference to Table 4, it can be seen that CIE x and CIE y co-ordinates are lower for Device Examples 2-5 than for Comparative Device 2; CRI values for the Device Examples 2-5 is higher; and colour temperature is higher.

TABLE 4

| Device | CIE x | CIE y | CRI | Correlated Colour Temperature |
|---|---|---|---|---|
| Comparative Device 2 | 0.512 | 0.442 | 61.5 | 2368 k |
| Device Example 5 | 0.471 | 0.425 | 68.2 | 2695 k |
| Device Example 4 | 0.476 | 0.428 | 67.5 | 2693 k |
| Device Example 3 | 0.474 | 0.428 | 67.8 | 2664 k |
| Device Example 2 | 0.479 | 0.432 | 67.1 | 2671 k |

With reference to Table 5, lifetime and change in voltage over time is similar for Comparative Device 2 and Device Examples 2-5.

TABLE 5

| Device | Initial Luminance (cd/m$^2$) | Max. T70 (hours) | Average T70 (hours) | Initial V | Initial J | ΔV at T70 |
|---|---|---|---|---|---|---|
| Comparative Device 2 | 2004 | 334 | 314 | 4.60 | 6.65 | 0.45 |
| Device Example 5 | 2005 | 337 | 323 | 4.87 | 7.38 | 0.49 |
| Device Example 4 | 2006 | 350 | 328 | 4.72 | 6.77 | 0.48 |
| Device Example 3 | 1998 | 336 | 316 | 4.66 | 6.50 | 0.46 |
| Device Example 2 | 1997 | 320 | 311 | 4.73 | 6.36 | 0.31 |

Although the present invention has been described in terms of specific exemplary embodiments, it will be appreciated that various modifications, alterations and/or combi-

The invention claimed is:

1. An organic white light-emitting device comprising:
   an anode;
   a cathode;
   a first light-emitting layer between the anode and the cathode, the first light-emitting layer comprising a fluorescent light-emitting material having a triplet excited state energy level $T_{1F}$ and a triplet-triplet annihilation (TTA) promoter having a triplet excited state energy level $T_{1T}$ wherein $T_{1F} > T_{1T}$, wherein the fluorescent light-emitting material:TTA promoter molar ratio is in the range of 80:20-99.9:0.1; and
   a second light-emitting layer between the anode and the cathode and adjacent to the first light-emitting layer, the second light-emitting layer comprising a phosphorescent material having a triplet excited state energy level $T_{1P}$ wherein $T_{1P} > T_{1T}$.

2. The organic light-emitting device according to claim 1, wherein the TTA promoter has a singlet excited state energy level $S_{1T}$ and the fluorescent light-emitting material has a singlet excited energy level $S_{1F}$ wherein $S_{1T} > S_{1F}$.

3. The organic light-emitting device according to claim 1, wherein the fluorescent light-emitting material is blended with the TTA promoter.

4. The organic light-emitting device according to claim 1, wherein the TTA promoter is bound to the fluorescent light-emitting material.

5. The organic light-emitting device according to claim 1, wherein the fluorescent light-emitting material is a blue light-emitting material.

6. The organic light-emitting device according to claim 1, wherein the fluorescent light-emitting material is a polymer comprising repeat units of formula (IV):

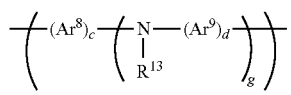
(IV)

wherein $Ar^8$ and $Ar^9$ in each occurrence are independently substituted or unsubstituted aryl or heteroaryl, g is greater than or equal to 1, $R^{13}$ is H or a substituent; c and d are each independently 1, 2 or 3; and any one of $Ar^8$, $Ar^9$ and $R^{13}$ bound directly to a N atom may be linked to another of $Ar^8$, $Ar^9$ and $R^{13}$ bound to the same N atom.

7. The organic light-emitting device according to claim 1, wherein the half-life of triplet excitons on the TTA promoter is at least 1 microsecond.

8. The organic light-emitting device according to claim 1, wherein the TTA promoter comprises substituted or unsubstituted anthracene.

9. The organic light-emitting device according to claim 1, wherein the TTA promoter is a polymer comprising repeat units of formula (V):

-(PAH)- (V)

wherein PAH represents a polyaromatic hydrocarbon that may be unsubstituted or substituted with one or more substituents.

10. The organic light-emitting device according to claim 9, wherein the TTA promoter is a polymer comprising substituted or unsubstituted repeat units of formula (Va):

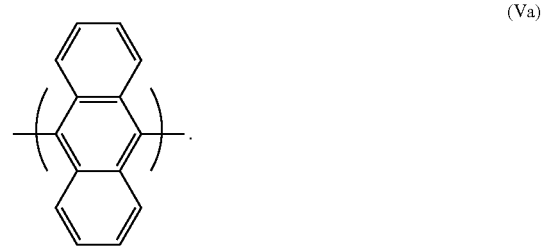
(Va)

11. The organic light-emitting device according to claim 10, wherein the repeat unit of formula (Va) is substituted with one or more $C_{1-20}$ alkyl groups.

12. The organic light-emitting device according to claim 1, wherein the phosphorescent light-emitting material is a red light-emitting material.

13. The organic light-emitting device according to claim 1, wherein the device comprises at least one further light-emitting layer.

14. The organic light-emitting device according to claim 13, wherein the at least one further light-emitting layer is spaced apart from the first light-emitting layer by the second light-emitting layer.

15. The organic light-emitting device according to claim 13, wherein the at least one further light-emitting layer is a green light-emitting layer.

16. The organic light-emitting device according to claim 13, wherein the at least one further light-emitting layer is a phosphorescent light-emitting layer.

17. A method of forming an OLED according to claim 1, comprising the steps of forming, in any order, the first light-emitting layer and second light-emitting layer over one of the anode and the cathode, and forming the other of the anode and the cathode over the first and second light-emitting layers wherein the first and second light-emitting layers are each independently deposited from a solution in at least one solvent followed by evaporation of the at least one solvent.

18. The method according to claim 17, wherein the first-deposited layer of the first and second light-emitting layers does not dissolve in the at least one solvent used to deposit the second-deposited layer and wherein the first-deposited layer is crosslinked prior to formation of the second-deposited layer.

* * * * *